United States Patent
Treu et al.

(10) Patent No.: US 7,745,273 B2
(45) Date of Patent: Jun. 29, 2010

(54) SEMICONDUCTOR DEVICE AND METHOD FOR FORMING SAME

(75) Inventors: Michael Treu, Villach (AT); Roland Rupp, Lauf (DE); Michael Rueb, Faak am See (AT); Rudolf Elpelt, Brlangen (DE)

(73) Assignee: Infineon Technologies Austria AG, Villach (AT)

( * ) Notice: Subject to any disclaimer, the term of this patent is extended or adjusted under 35 U.S.C. 154(b) by 286 days.

(21) Appl. No.: 11/830,542

(22) Filed: Jul. 30, 2007

(65) Prior Publication Data

US 2009/0032848 A1    Feb. 5, 2009

(51) Int. Cl.
*H01L 21/337*   (2006.01)
*H01L 21/425*   (2006.01)

(52) U.S. Cl. .................. 438/186; 438/526; 438/192; 257/E21.447; 257/E21.445

(58) Field of Classification Search ............. 438/186, 438/526, 192, 363; 257/E21.447, E21.346, 257/E21.445
See application file for complete search history.

(56) References Cited

U.S. PATENT DOCUMENTS 6,034,385 A    3/2000 Stephani et al.
6,459,108 B1    10/2002 Bartsch et al.
6,661,042 B2 *    12/2003 Hsu .................... 257/239
2007/0114626 A1 *    5/2007 Kang et al. ............ 257/431

FOREIGN PATENT DOCUMENTS

| WO | WO-97/23911 A1 | 7/1997 |
| WO | WO-98/49762 A1 | 11/1998 |
| WO | WO-00/05768 A1 | 2/2000 |
| WO | WO-00/16402 A1 | 3/2000 |
| WO | WO-02/09195 A1 | 1/2002 |

* cited by examiner

*Primary Examiner*—Walter L Lindsay, Jr.
(74) *Attorney, Agent, or Firm*—Dickstein, Shapiro, LLP.

(57) ABSTRACT

A method for manufacturing a semiconductor device. The method includes providing a semiconductor body of a conductivity type, wherein the semiconductor body comprises a first surface. At least one buried region of a second conductivity type is formed in the semiconductor body and at least a surface region of the second conductivity type is formed at the first surface of the semiconductor body, wherein the buried region and the surface region are formed such that they are spaced apart from each other. The buried region is formed by deep implantation of a first dopant of the second conductivity type.

24 Claims, 18 Drawing Sheets

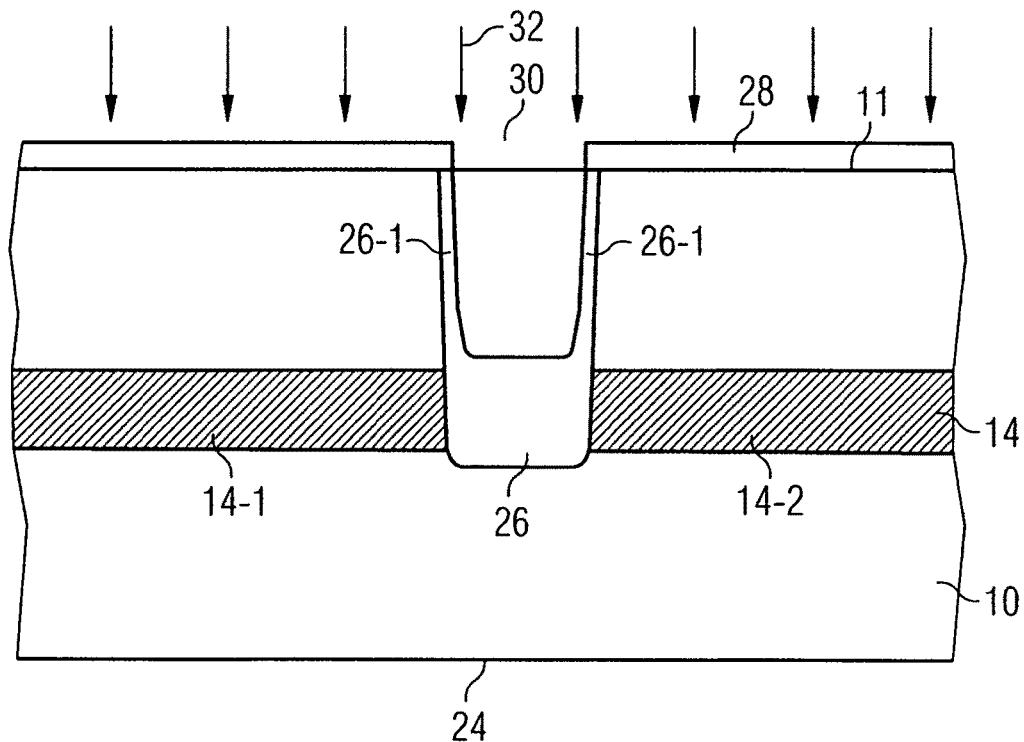
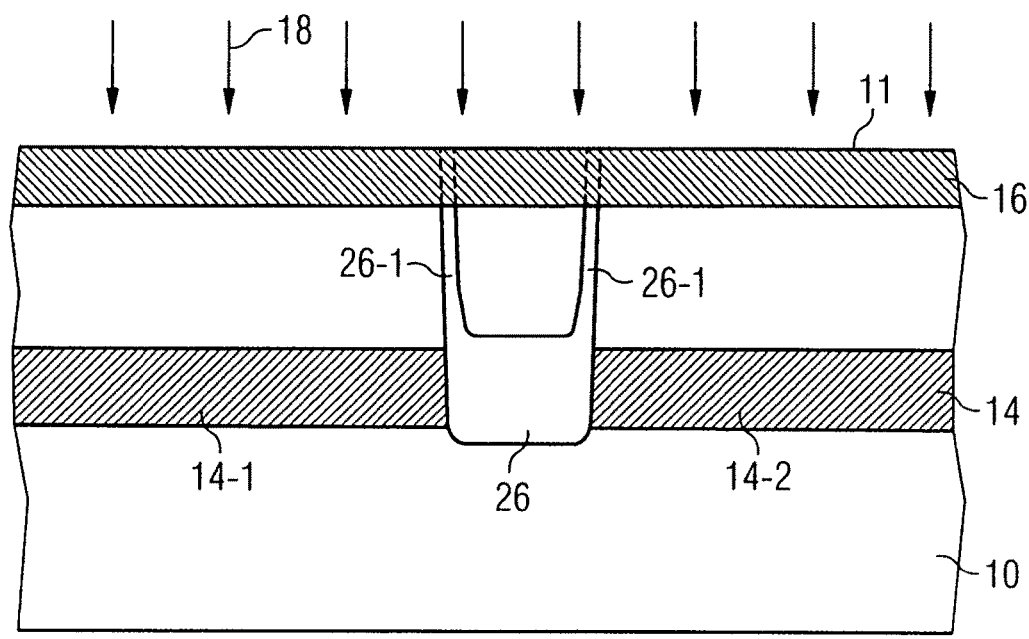

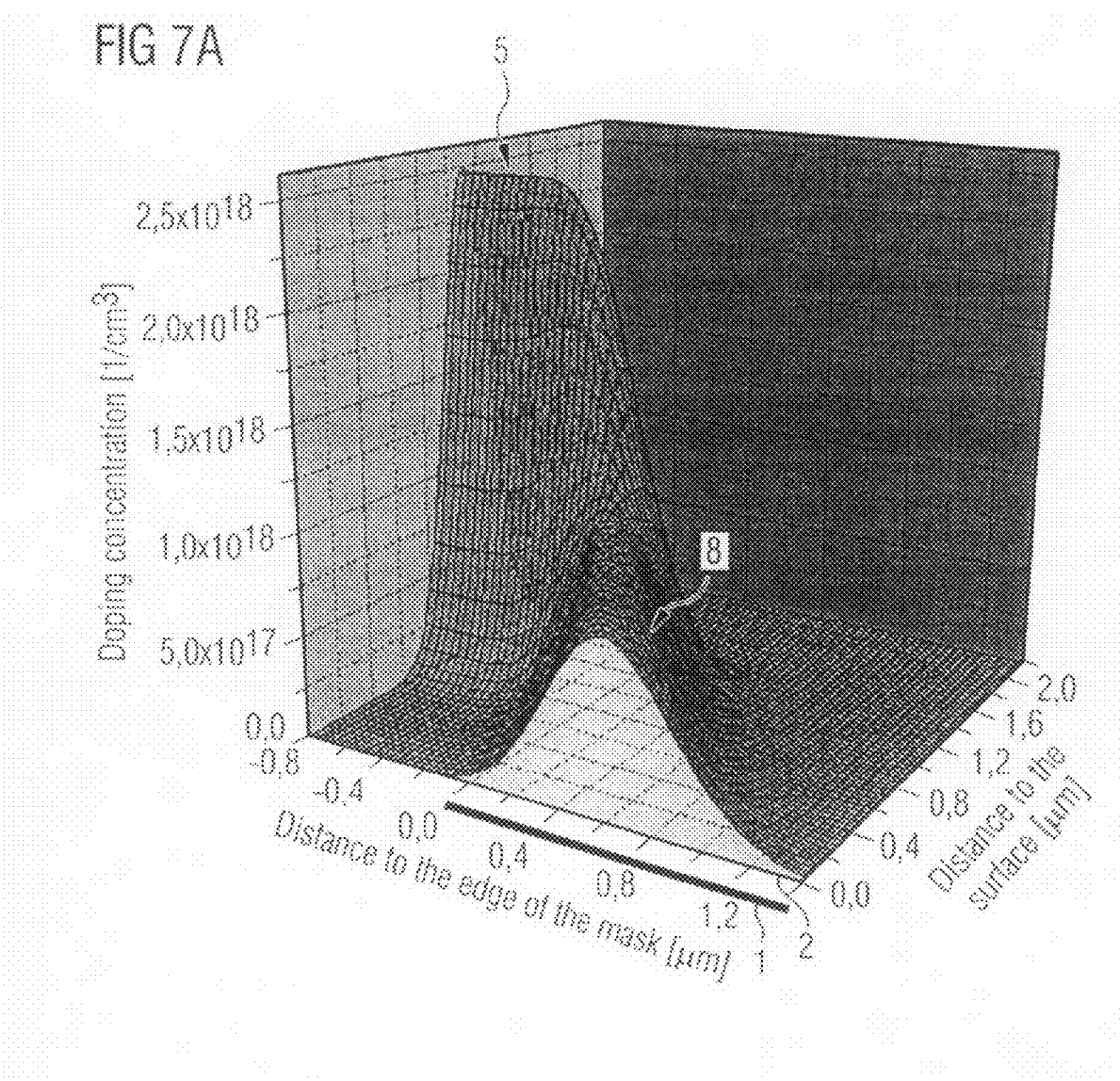

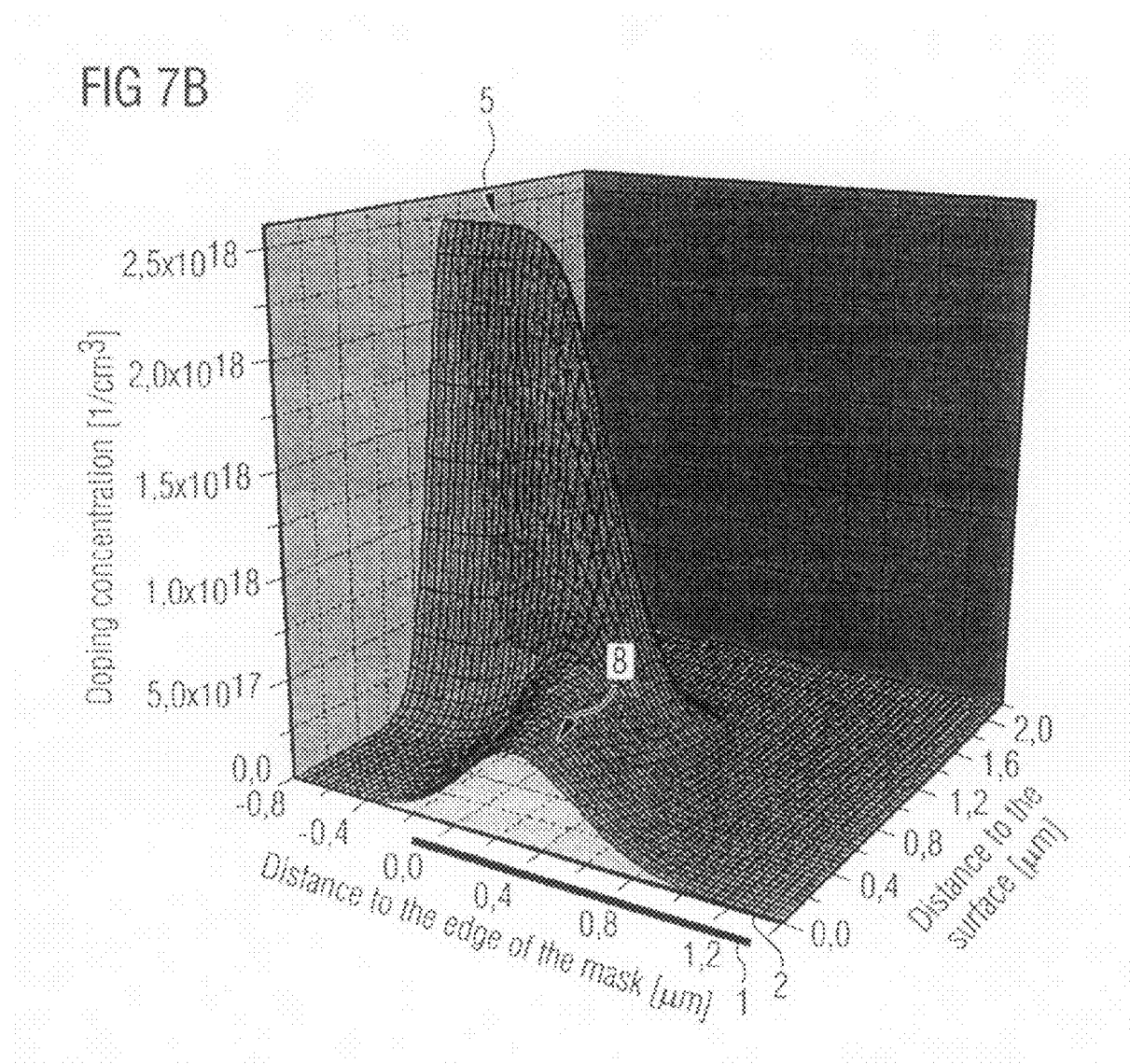

SEMICONDUCTOR DEVICE AND METHOD FOR FORMING SAME

BACKGROUND OF THE INVENTION

Semiconductor devices often comprise functional layers which are formed epitaxially. Epitaxial deposition allows the formation of a single-crystalline material and is thus a versatile method which is used for the manufacture of a variety of power semiconductor devices such as such SiC JFETs (Silicon Carbide Junction Field Effect Transistors). During deposition, the deposited material can be doped so that a subsequent doping by implantation is often not required.

The epitaxial deposition, however, requires delicate handling and is rather expensive. Despite advanced control systems and adopted deposition chambers, fluctuations of both the thickness and the doping concentration may occur which could adversely affect the performance of the thus manufactured semiconductor devices. For example, the pinch-off voltage of a JFET is determined by the geometry and doping concentration of its channel. Variation of any of these parameters changes the pinch-off voltage to unwanted values and can alter the saturation characteristics of the JFET. Further, a plurality of separate epitaxial deposition steps is required for forming a JFET. In view of this, there is an ongoing desire to improve the manufacturing procedures to obtain high quality devices with well defined and uniform characteristics.

BRIEF SUMMARY

According to an embodiment, a method for manufacturing a semiconductor device is provided. The method comprises providing a semiconductor body of a first conductivity type, which comprises a first surface. At least one buried region of a second conductivity type is formed in the semiconductor body by deep implantation of a first dopant of the second conductivity type, and at least a surface region of the second conductivity type is formed in the semiconductor body at the first surface of the semiconductor body, wherein the buried region and the surface region are formed such that they are spaced apart from each other.

According to another embodiment, a semiconductor device is provided which comprises a semiconductor body of a first conductivity type. At least two buried regions of a second conductivity type are arranged in the semiconductor body in spaced relation to the first surface, the buried regions are substantially arranged in a same plane and are spaced apart from each other by a spacer region of the first conductivity type. A surface region of the second conductivity type is arranged at the first surface of the semiconductor body, wherein the buried region and the surface region are spaced apart from each other. At least one buried compensation region of the first conductivity type is arranged in the semiconductor body. The buried compensation region defines the spacer region and comprises a doping concentration of the first conductivity type which is higher than the doping concentration of the second conductivity type of the buried regions.

According to another embodiment, a semiconductor device is provided which comprises a semiconductor body of a first conductivity type comprising a first surface. At least two buried regions of a second conductivity type are arranged in the semiconductor body in spaced relation to the first surface. The buried regions are substantially arranged in a same plane and are spaced apart from each other by a spacer region of the first conductivity type. A surface region of the second conductivity type is arranged at the first surface, wherein the buried region and the surface region are spaced apart from each other. A channel region of the first conductivity type is arranged between the buried regions and the surface region, the channel region comprising a doping concentration of the first conductivity type. At least one buried compensation region of the first conductivity type is arranged in the channel region above the spacer region, wherein the doping concentration of the buried compensation region is higher than the doping concentration of the channel region.

The formation of the buried layer in the semiconductor body can be finely controlled so that variations of its arrangement, thickness and doping concentration can be reduced. Likewise, the distance to other functional regions such as the surface region can be finely and easily adjusted. By doing so, the performance characteristics of the semiconductor device are improved and the variation between individual devices reduced. Further, deep implantation allows reduction of the numbers of epitaxial layer depositions.

BRIEF DESCRIPTION OF DRAWINGS

A full and enabling disclosure of the present invention, including the best mode thereof, to one of ordinary skill in the art, is set forth more particularly in the remainder of the specification, including reference to the accompanying figures. Therein:

FIGS. 3A to 3D illustrate method steps of another modified embodiment.

FIGS. 7A and 7B illustrate the doping profile of a buried region depending on the flank angle of an implantation mask.

DETAILED DESCRIPTION OF THE INVENTION

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only.

The term "lateral" as used in this specification intends to describe an orientation parallel to the main surface of a semiconductor wafer or die.

The term "vertical" as used in this specification intends to describe an orientation which is arranged perpendicular to the main surface of the semiconductor wafer or die.

The term "deep implantation" as used in this specification intends to describe an implantation of a dopant which results in the formation of a buried doping region spaced to the surface of the semiconductor body. The buried regions can be formed at different depths depending on the implantation energy used.

Contrary thereto, the term "shallow implantation" as used in this specification intends to describe an implantation of a dopant which results in the formation of a doping region at the surface of the semiconductor body.

Specific embodiments described in this specification pertain to power semiconductor devices and particularly to junction field-effect transistors (JFET) without being wished to be limited thereto.

Figure 6A:
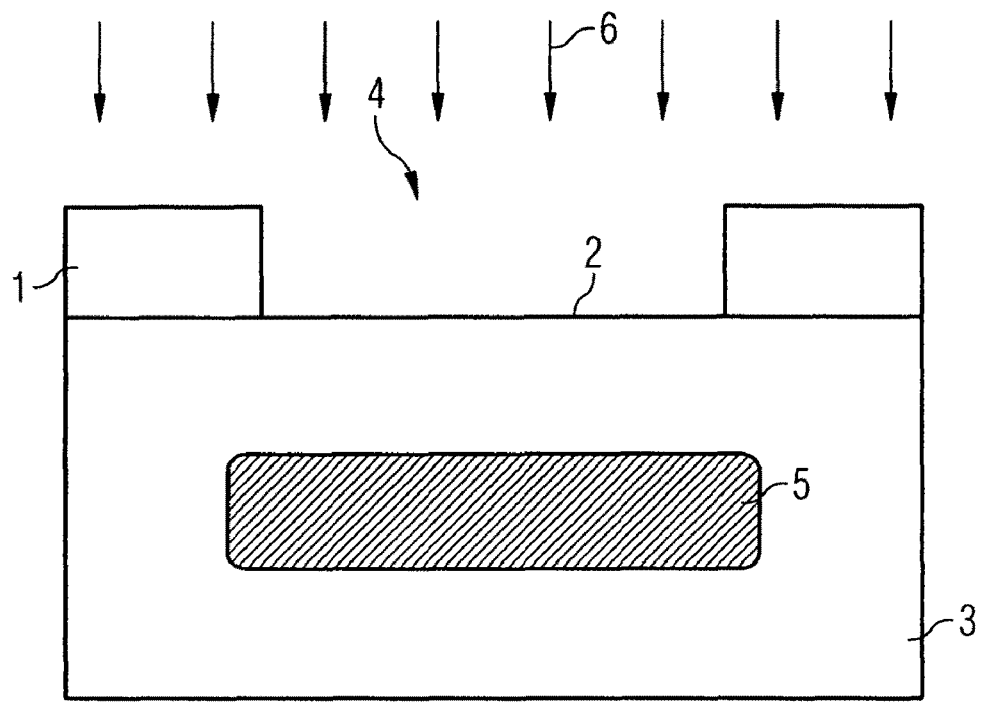
FIGS. 6A and 6B illustrate method steps of another embodiment.
Figure 6B:
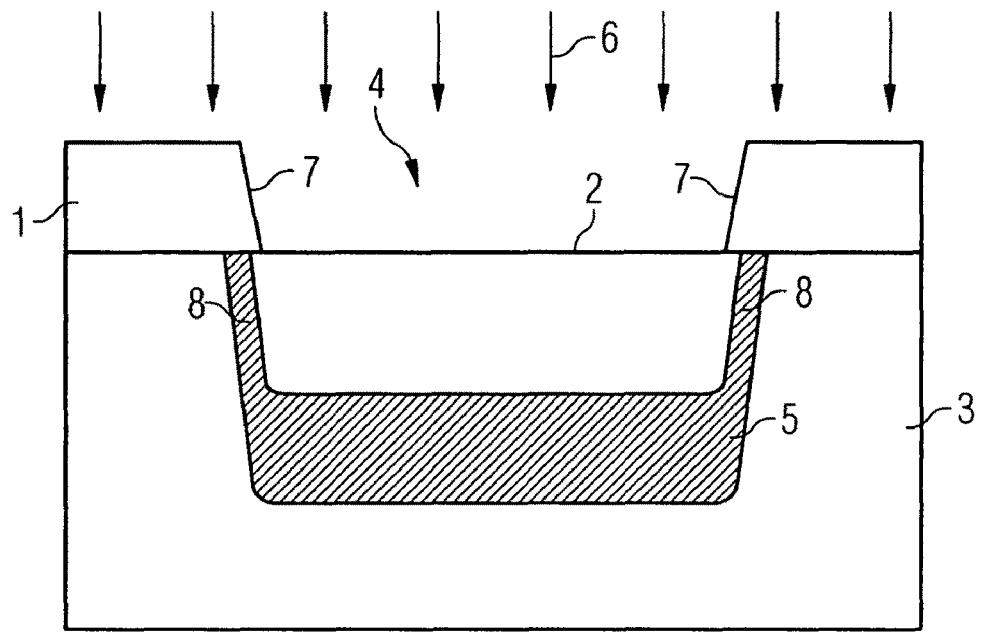

A first approach for forming a buried region is illustrated in FIGS. 6A and 6B. A mask 1 is formed on a first surface 2 of a semiconductor body 3, which can be comprised of any suitable semiconductor material such silicon or silicon carbide. The mask 1 comprises an opening 4 which defines the location and lateral extension of a buried region 5 which is subsequently formed. A dopant 6 is than implanted with high energy resulting in the formation of the buried region 5. By using deep implantation, the dopant 6 is brought deep into the semiconductor body 1 such that the peak concentration of the implanted dopant 6 will be in an area which is spaced to the first surface 2. By appropriately selecting the implantation energy the implantation depth (distance of the thus formed buried region 5 from the first surface 2) can be precisely adjusted. Further, expensive deposition of epitaxial layers can be avoided. In addition to that, by avoiding epitaxial deposition interference with alignment marks arranged on the semiconductor body are reduced. Alignment marks are for aligning litho-graphical masks with the semiconductor body.

Detailed examinations of the doping profile of deeply implanted regions have revealed, however, that artefacts occur at the border of the buried region 5. Such artefacts are illustrated in FIG. 6B and will be referred to in the remainder of this description as "doping extensions". Doping extensions 8 are narrow regions which extend from the outer border of the buried region 5 up to the first surface 2 and cause the formation of unwanted npn- or pnp-structures in the area above the buried region 5 which would inhibit or at least interfere with a current flow therethrough.

It is assumed, without being wished to be tight thereto, that doping extensions 8 are for instance caused by non-vertical mask flanks 7 as illustrated in FIG. 6B. Vertically impinging dopants 6 striking the non-vertical mask flanks 7 are scattered or reflected and thus deviate from an ideal vertical incident direction. Such scattered or reflected dopants do not reach as far as non-scattered dopants and thus form rather shallow doping regions. Since the reflection and scattering is closely related with the mask flanks 7 the doping extension 8 are formed close to and below the mask flanks.

A more realistic impression of the formation of doping extensions 8 is given in FIGS. 7A and 7B which shows simulation of a 3-dimensional doping profile of a buried region depending on the angle of the mask flanks. In both simulations, the edge of the mask 1 is at 0 μm while the mask 1 extends along positive values. In FIG. 7A the angle of mask flank with respect to the surface of the semiconductor body is 70° while in FIG. 7B 80°. For both Figures the following has been assumed: (i) Implantation of aluminum at energy of about 1400 keV; (ii) Implantation dose of about $1*10^{14}/cm^2$ assuming a Gaussian beam distribution; (iii) Silicon oxide mask.

As it becomes apparent when comparing these simulations, the doping extensions 8 are formed like ridges which extend from the border of the buried region 5 in a slanted manner with respect to a normal of the first surface 2. Although the peak doping concentration significantly drops at the transition of the buried region 5 to the doping extension 8 it remains sufficiently high to interfere with the background doping. For mask flanks 7 having an angle of about 70° with respect to the first surface 2, the doping extension 8 may have a peak doping concentration at the first surface 2 of about $1*10^{18}/cm^3$ which is still significant in comparison to the peak concentration of about $2.5*10^{18}/cm^3$ of the buried region 5. By increasing the angle of the mask flanks 7 the peak doping concentration of the doping extensions 8 at the first surface 2 can be reduced as shown in FIG. 7B to have a peak doping concentration of about $0.5*10^{18}/cm^3$.

The angle of mask flanks 7 also determines the location of the doping extensions 8. In FIG. 7A, the peak concentration of the doping extension 8 at the first surface is laterally spaced by about 0.6 μm to the mask flank 7 while in FIG. 7B by about 0.3 μm only.

For reducing the doping extensions the implantation mask should therefore have ideally vertical mask flanks. However, since the mask 1 needs a certain thickness when used as implantation mask for deep implantation, it is likely that non-ideal mask flanks will be formed and thus, the above described phenomenon will occur. Furthermore, even with ideally vertical mask flanks, the formation of doping extensions might not be prevented due to scattering phenomenon within the semiconductor body and along the mask flanks. Further, the angle of incident of the dopant will not be perfectly perpendicular to the first surface and exhibits a certain variation. Hence, even with vertical mask flank, scattering or reflection and therefore doping extensions might occur.

In view of this, the above described embodiment might be modified to reduce the adverse influence of the doping extensions on other functional regions. It is, however, noted that the following modifications might not be required if the extent of the doping extension, particularly its peak doping concentration, can be significantly reduced by forming substantially vertical or even overhanging mask flanks or by reducing the fluctuations of the incident angle of the dopant. In some embodiments, the doping extensions are tolerable and thus no modifications are needed either.

The above described artefacts can be at least partially compensated by suitably arranging compensation regions of a conductivity type opposite to the conductivity type of the buried region. For instance, the compensation regions are arranged in the area where the doping extensions are formed. Another option is to place a compensation region into a buried region which allows "structuring" of the buried region. In this case, the buried region might be formed without using a mask to avoid formation of doping extensions. These and other options will become more apparent in conjunction with the more detailed description of the following embodiments.

With reference to FIGS. 1A to 1F an embodiment relating to a method for forming a semiconductor device, particularly a JFET, comprising a buried region will be described. It is, however, noted that the method is not restricted thereto and can be used for manufacturing other semiconductor devices which comprise a buried region.

A semiconductor body 10 of a first conductivity type having a first surface 11 is provided. The semiconductor body 10 can be comprised of any suitable semiconductor material such as silicon (Si), silicon carbide (SiC) or a junction semiconductor such as gallium arsenide (GaAs). In this specific embodiment, the semiconductor body 10 is comprised of n-doped (first conductivity type) SiC. For power semiconductor devices, SiC is typically used since sharper or steeper doping profiles can be formed in SiC due to the reduced diffusion during post-implantation annealing steps. Typically, the semiconductor body 10 comprises a highly doped single-crystalline substrate and a lowly doped epitaxial layer formed on a surface of the substrate. The epitaxial layer may have a minimum thickness in a range from about 4 μm to about 6 μm and a maximum thickness in a range from about 30 μm to about 40 μm. These ranges are typical for unipolar devices. Bipolar devices may have an even thicker epitaxial layer. The doping concentration and the thickness of the epitaxial layer define the breakdown voltage of the device. Since single-crystalline SiC substrates are commonly typically highly doped, a lowly doped epitaxial layer is deposited to allow production of power semiconductor devices with high breakdown voltages. Moreover, the epitaxial layer can comprise doping steps, i.e. that the doping concentration has been varied step-wise during deposition. This improves the breakdown characteristic of the device to be formed. If a lowly doped singly crystalline substrate is used, an epitaxial layer may not be required. In the following description, the term "semiconductor body" includes the low-doped epitaxial layer, and the semiconductor regions are formed in the low-doped epitaxial layer on a not shown single-crystalline substrate.

Unlike common semiconductor devices such as JFETs, no additional separate epitaxial deposition steps are required to form the functional regions of the semiconductor device. Instead, deep and shallow implantation steps are used. Therefore only a single epitaxial deposition is used to form a main epitaxial layer (which is denoted in some of the Figures by 10-2), in which the functional regions are formed by appropriate implantation.

By using deep implantation of a first dopant 12 of a second conductivity type (p-type in this embodiment), such as aluminum or boron, a buried region 14 is formed in spaced-relation to the first surface. The deep implantation is carried out in this embodiment without an implantation mask (unmasked or blanket implantation); hence, the buried region 14 extends substantially laterally in the entire semiconductor body 10.

The first dopant 12 is implanted with a specific implantation energy which defines the vertical location or depth of the buried region 14 in the semiconductor body 10. A typical energy range for this deep implantation is from about 1000 keV to about 1800 keV. In some embodiments, mean implantation energy of about 1400 keV is used. The resulting distance between the buried region 14 and the first surface 11, i.e. the distance between the upper edge (defined by a pn-junction) of the buried region 14 and the first surface will be in the range from about 500 nm to about 900 nm.

The implantation dose used is typically in the range from about $0.5*10^{14}/cm^2$ to about $2*10^{14}/cm^2$ and can be for instance $1*10^{14}/cm^2$.

Depending on the implantation dose and energy used the buried region 14 has a typical peak doping concentration from about $1*10^{18}/cm^3$ to about $6*10^{18}/cm^3$ and more particularly from about $2*10^{18}/cm^3$ to about $3*10^{18}/cm^3$. In some embodiments the peak doping concentration can be from about $4*10^{18}/cm^3$ to about $5*10^{18}/cm^3$. In other embodiments the peak doping concentration can be from about $2*10^{18}/cm^3$ to about $5*10^{18}/cm^3$.

Figure 1A:
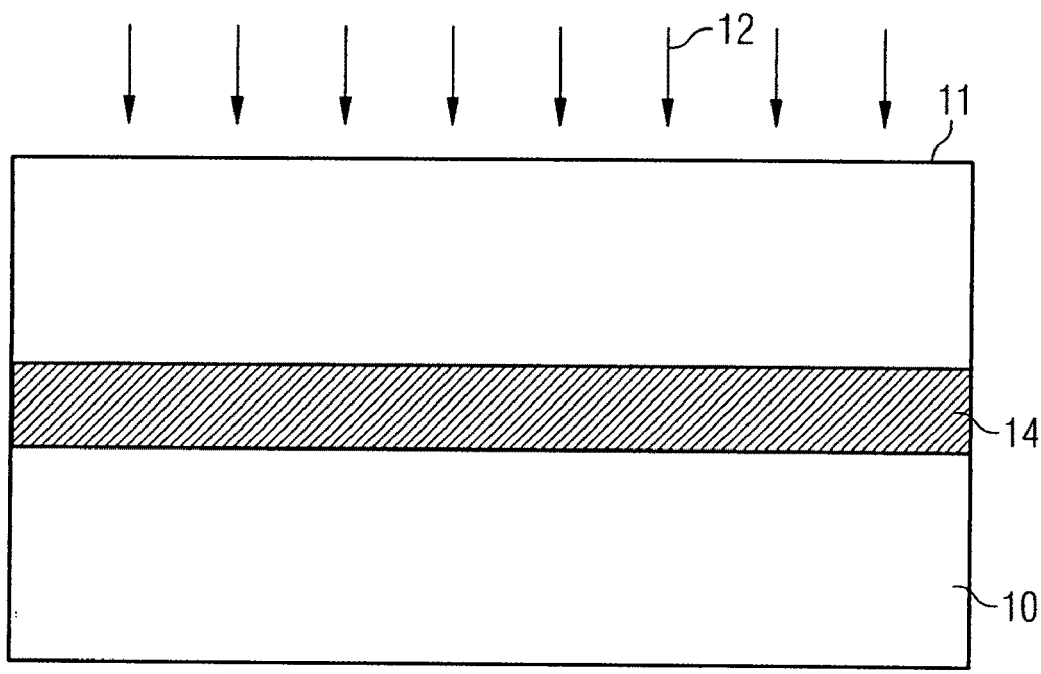
FIGS. 1A to 1F illustrate method steps of an embodiment relating to a method for forming a semiconductor device comprising a buried region.
Figure 1B:
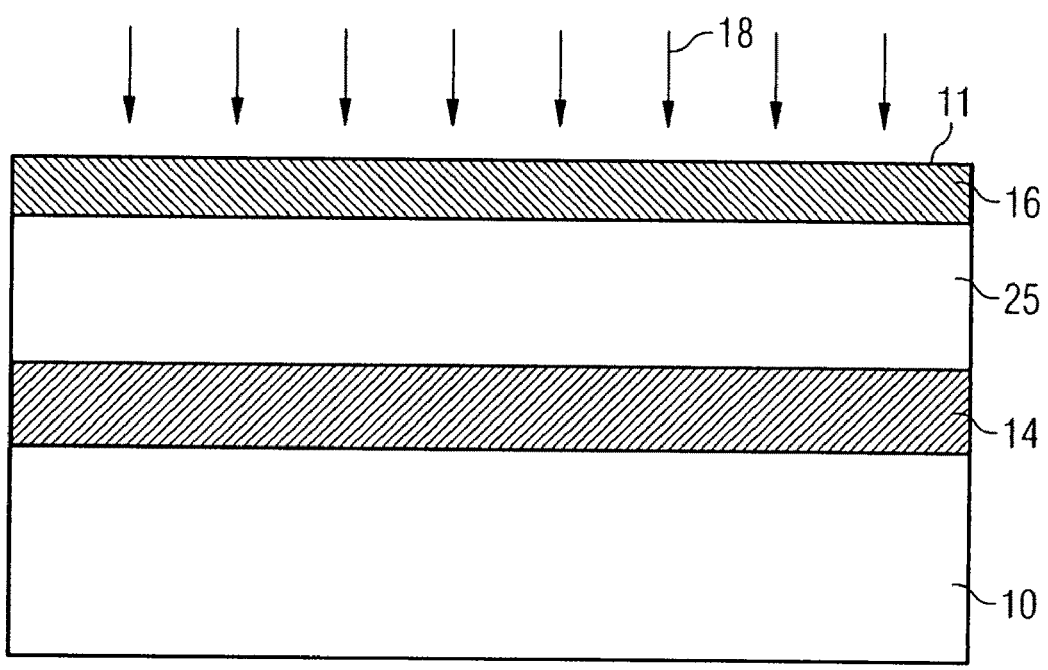

Subsequently, as illustrated in FIG. 1B, a surface region 16 of the second conductivity type is formed in the semiconductor body 10 at the first surface 11 of the semiconductor body 10 and above the buried region 14. The surface region 16 can be for instance formed by shallow implantation of a dopant 18 of the second conductivity type, which will be referred to hereinafter as third dopant 18. Typical examples of the third dopant 18 are aluminium and boron, which are particularly used for doping of SiC. The implantation dose can be similar to the implantation dose used for the buried region 14 and is for example in the range from about $0.5*10^{14}/cm^2$ to about $2*10^{14}/cm^2$ and particularly about $1*10^{14}/cm^2$, which will result in substantially the same peak doping concentration as given above for the buried region 14. Different to the deep implantation, the implantation energy for the surface region 16 is substantially lower and can be in the range from about 30 keV to about 140 keV. In this specific embodiment, the surface region 16 is also mask-less implanted (blanket implantation). For forming surface region 16, typically two implantation steps at different implantation energies are used. A skilled will appreciate that one or more than two implantation steps can be used as well.

The surface region 16 is arranged close to or at the first surface 11 of the semiconductor body 10. For instance, its peak doping concentration can be arranged slightly spaced to the first surface 11. It is, however, intended in this embodiment that the surface region 16 is arranged such that the first surface 11 is of the second conductivity type.

In this embodiment, the buried region 14 and the surface region 16 will later form the gate or body regions of a JFET. The region of the first conductivity type arranged between, and separating, the laterally extending regions 14 and 16 is the channel region 25 of the JFET. To ensure a sufficient spacing between the surface region 16 and the buried region 14, the latter should be formed deeply enough in the semiconductor body 10. A typical example for the vertical distance between the buried region 14 and the surface region 16 is from about 200 nm to about 600 nm. A skilled person will, however, appreciate that the vertical distance can be varied according to specific needs.

The order of the deep and shallow implantation can be reversed although the deep implantation is typically carried out before the shallow implantation to avoid the adverse impact of a disturbed or amorphous surface on the deep implantation caused by a preceding shallow implantation.

Optional post-implantation annealing steps can be performed after each implantation or after a group of implantations. It also possible to combine the annealing steps in a final annealing step. Annealing may take place at temperature form about 1400° C. to about 1800° C. and typically at about 1700° C. If a rapid thermal anneal (RTA) is used, the semiconductor body can be annealed for about 60 sec to about 90 sec. In case of a furnace anneal, the annealing time can be about 30 min. A skilled person will appreciate that the annealing time depends on the annealing temperature and can therefore vary significantly. An optional surface protection layer comprised of, for example, graphite, can be formed on the surface of the semiconductor body 10 to reduce surface diffusion.

Figure 1C:
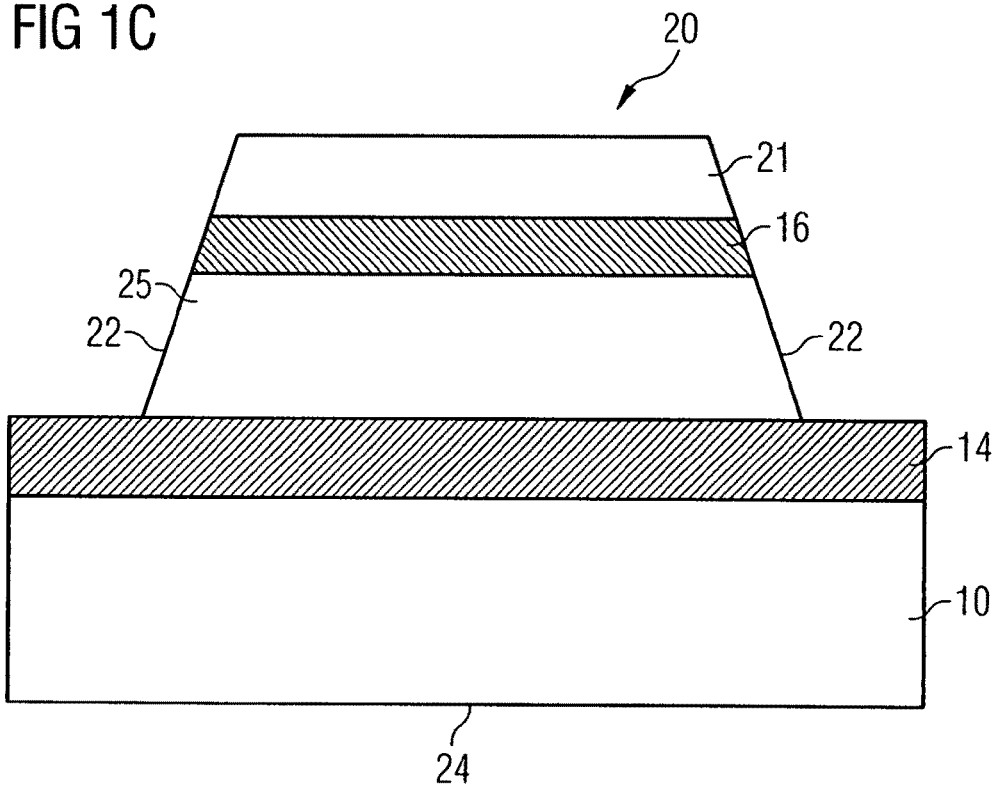

As shown in FIG. 1C, portions of the semiconductor body 10 are removed to partially expose the buried region 14 and to form at least one mesa-structure 20 which partially covers the buried region 14. Typically, a mask 21 is formed on the first surface 11 and suitable structured, for instance by lithography. The mask 21 can either be a resist mask or a hard mask. Suitable mask materials are resist, metal such as nickel, and oxide. In case of SiC as the material of the semiconductor body 10, an appropriate etch gas is used which can be selected for example from the group comprising $SF_6$, $CF_4$, $O_2$, chlorine-based etching gases, and mixtures thereof. Typically, a plasma-etching process is used. The resulting structure is shown in FIG. 1C with the mesa-structure 20 having here slanted flanks 22.

Figure 1D:
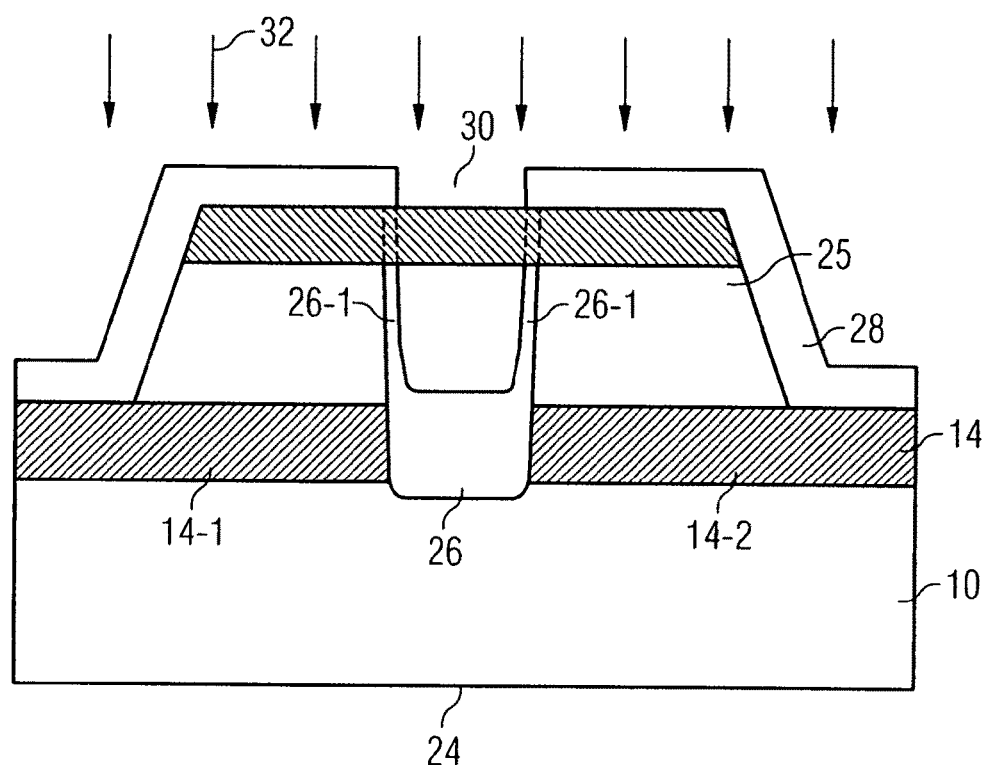

In some embodiments, for instance in case of a JFET, an electrical connection between the channel 25 and a second surface 24 arranged opposite to the first surface 11 is desired. Further, a structured buried region 14 is desired in some applications. To this end, at least two buried regions which are substantially arranged in a same plane and are spaced apart from each other by a spacer region of the first conductivity type are formed. The plane is arranged substantially parallel to the first surface 11 and spaced to it. FIG. 1D gives an example how these two regions can be formed.

The buried region 14 as described above forms here an unstructured primary buried region. This primary buried region 14 is subsequently structured or partitioned by a buried compensation region 26 of the first conductivity type. To this end, the buried compensation region 26 is formed in a portion of the primary buried region 14 such that it reverses there the conductivity type of the primary buried region. The portion of the reversed conductivity defines the spacer region 26. The thus formed spacer region 26 provides an electrical connection between the channel region 25 and the second surface 24.

By this approach, the primary buried region 14 is indirectly structured. This results in the formation of at least two laterally spaced apart buried regions 14-1 and 14-2. Since the primary buried region 14 is mask-less implanted, no doping extensions are formed and thus no unwanted pnp or npn transitions occur. On the other hand, for forming the buried compensation region 26 a mask 28 (FIG. 1D) is used which causes formation of doping extensions 26-1 of the buried compensation region 26. However, since the buried compensation region 26 is of the first conductivity type like the channel region 25, no unwanted pnp- or npn-transitions are formed in the channel region 25.

For forming the buried compensation region 26, mask 28 is formed on the surface of the semiconductor body 10 and suitably structured to have an opening 30 which defines the lateral location of the buried compensation region 26. For example, mask 28 can be formed in a self-aligned manner with respect to mask 21 by isotropically etching mask 21 so that only a central portion of the mesa-structure 20 remains covered by the etched mask 21. Mask 28 is then formed on the uncovered portions of the mesa-structure 20. Mask 28 can be comprised of the same or a different mask material of mask 21 as described above. Typically, mask 28 is a hard mask such as an oxide mask. A second dopant 32 of the first conductivity type, for example nitrogen or phosphorous, is then deeply implanted. For reversing the conductivity of primary buried region 14, the second dopant 32 is implanted with a total dose which is higher than the dose used for implanting the primary buried region 14. For example, the total dose of the second dopant 32 can be higher than $2*10^{14}/cm^2$ and particularly higher than $3*10^{14}/cm^2$. The resulting peak doping concentration can be from about $4*10^{18}/cm^3$ to about $1*10^{19}/cm^3$ or even higher than $1*10^{19}/cm^3$, which is sufficiently higher than the above given examples for the doping concentration of the primary buried region 14 to reliably reversing the conductivity type.

Figure 8:
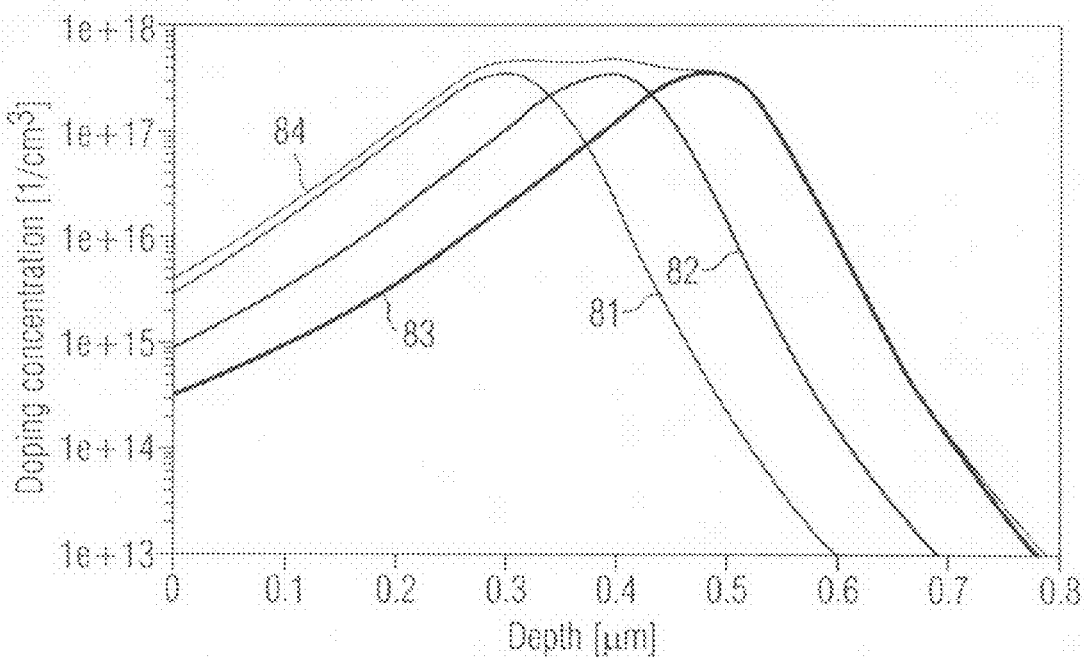
FIG. 8 illustrates the resulting doping concentration of a compensation region formed by separate implantation steps at different implantation energies.

For ensuring that the conductivity type of the primary buried region 14 is reversed in the spacer region 26, the deep implantation of the second dopant 32 can comprise at least two separate implantations steps which are carried out at different implantation energies. Different implantation energies lead to different implantation depth so that the buried compensation region 26 has a vertical extension or thickness which is larger than the vertical extension or thickness of the primary buried region 14. For illustration, the resulting doping profile of a deep implantation using three separate implantation steps at different energies is for instance shown in FIG. 8. Therein, 81, 82, 83 denotes the doping profile of the individual implantation steps while 84 denotes the resulting doping profile of the three steps. As it becomes apparent from FIG. 8, the resulting doping profile 84 has a significant vertical extension (extension in depth direction) at peak doping concentration, which leads to a box-like doping profile.

The implantation energies for the buried compensation region, irrespective of whether one, two or three implantation steps have been used, can be for instance in the range from about 800 keV to about 2000 keV. A skilled person will appreciate that even more steps can be applied if desired.

The doping concentration of the doping extensions 26-1 decreases in vertical di-reaction towards the first surface 11 of the semiconductor body 10 as described above in conjunction with FIGS. 5A and 5B. The reduction will be more pronounced if the implantation mask 28 used comprises substantially vertical mask flanks. It is therefore desired to form substantially vertical mask flanks. Further, an implantation beam with a reduced variation or fluctuation of the incident angle is also desired.

In many applications, the doping concentration of the doping extensions 26-1 near to the first surface 11 will be lower than the doping concentration of the surface region 16 so that no reversal of the conductivity type occurs in the surface region 16. The doping extensions 26-1 have been therefore indicated in FIG. 1D in the area of the surface region 16 by a dashed line.

In case that the doping extensions 26-1 cause a conductivity reversal in the surface region 16 an optional additional shallow implantation of a dopant of the second conductivity type provides an appropriate compensation therefor.

Figure 1E:
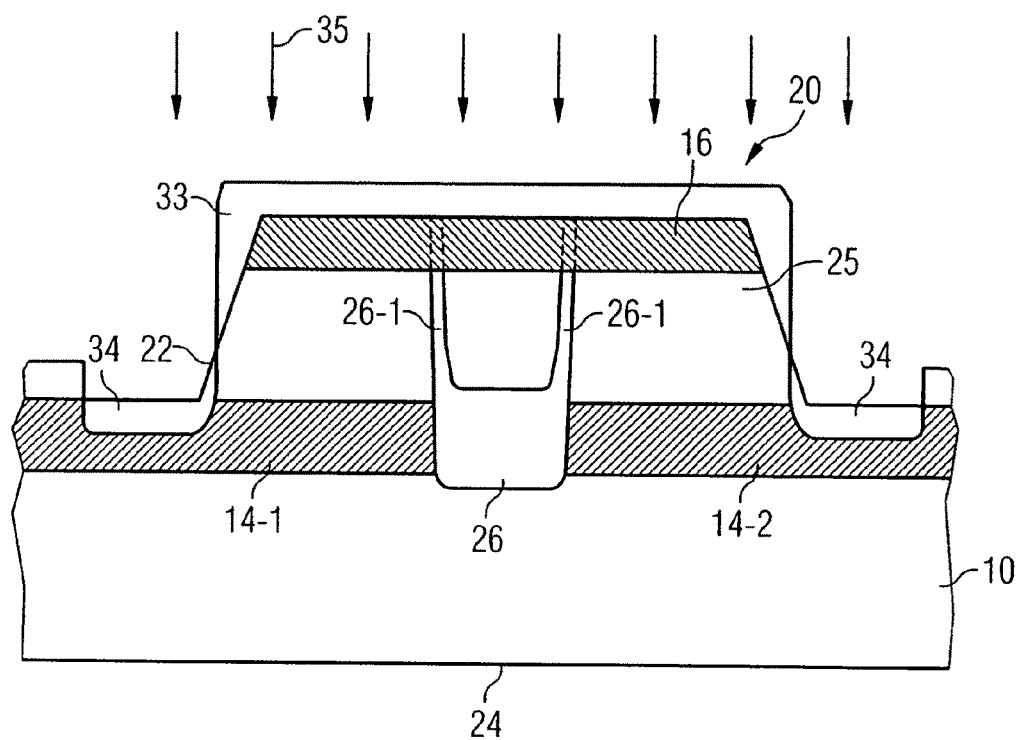

In a further step, which is illustrated in FIG. 1E, at least a source region 34 of the first conductivity type is formed in the semiconductor body 10 by implantation of a fourth dopant 35 of the first conductivity type such that the source region 34 is at least partially arranged in an exposed area of the buried region 14-1, 14-2 and adjacent to the mesa-structure 20. Typically, at least two source regions 34 are implanted in exposed portions of the buried regions 14-1 and 14-2 such that the source regions 34 contact the channel region 25 at the in the slanted flanks 22 as indicated in FIG. 1E. A typical implantation dose region for implantation of the source regions 34 is from about $5*10^{14}/cm^2$ to about $1.5*10^{15}/cm^2$ and can be, for example, $9*10^{14} cm^2$. The final doping concentration of the source regions 34 will be typically in the range from about $1*10^{18}/cm^3$ to about $1*10^{19}/cm^3$. For this implantation, a mask 33 is used.

In further steps, at least a first electrode layer 36 is formed on the mesa-structure 20 for contacting the surface region 16. Further, second electrode layers 38 are formed on the source regions 34 and the exposed buried region 14-1 and 14-2 for providing an electrical contact to these regions. The first and second electrode layers 36 and 38 are comprised of a conductive material such as a metal. Typical examples of the material used are Ti, Al, TiAl, NiAl, and NiSiAl. For example, for first electrode layer 36, a metal layer with a high Al-content of more than about 30% or more than about 40%, for example about 50% Al, is desired to form a good ohmic contact to p-doped surface region 16. Different thereto, for second electrode layer 38, a low Al-content metal of less than 10% Al is desired to form a good contact to n-doped source region 34. This may increase the contact resistance of the second electrode layer 38 to the buried regions 14-1, 14-2. This, however, is uncritical for many applications since the main purpose of the second electrode layer 38 is to contact the source region 34. First and second electrode layers 36, 38 form together the gate terminals of the JFET terminal for contacting the channel 25.

Furthermore, a third electrode layer 40 is formed on the second surface 24 for providing a drain terminal.

Additionally, the doping concentration of the channel 25, i.e. the region arranged between the buried regions 14-1 and 14-2 and the surface region 16 can be adjusted to a predefined peak-value. This can be done by implantation of a dopant of the first conductivity type (for example nitrogen or phosphorous) approximately into a central plane of the channel region 25. In a symmetrical JFET (with respect to a cross-section perpendicular to the first surface 11 as illustrated for instance in FIG. 1F), the middle portion of the channel 25 between the two gate or body regions (buried regions 14-1, 14-2 and surface region 16) significantly contributes to the current flow of the JFET. To reduce the electrical resistance and to define the pinch-off voltage, the peak doping of the channel 25 in its middle portion should be suitably adjusted. Typically, the peak doping will be in the range from about $2*10^{17}/cm^3$ to about $5*10^{17}/cm^3$. The dopant can be implanted, for example, with energy from about 300 keV to about 600 keV and at a dose from about $3*10^{12}/cm^2$ to about $5*10^{12}/cm^2$. The contribution of the doping extensions 26-1 to the final doping concentration should be considered when selecting the implantation dose.

A skilled person will appreciate that the channel doping can be done prior to the formation of the mesa-structure 20 as illustrated in other embodiments.

The above described implantation steps for forming the buried region, the surface region, source region and channel doping can also be performed at elevated temperatures up to about 1000° C. Heating the semiconductor body 10 shifts the amorphisation of the SiC material to higher implantation doses. Therefore, particularly for implantation steps at high doses, such as the source region implantation, high temperature implantation is of advantage.

Figure 1F:
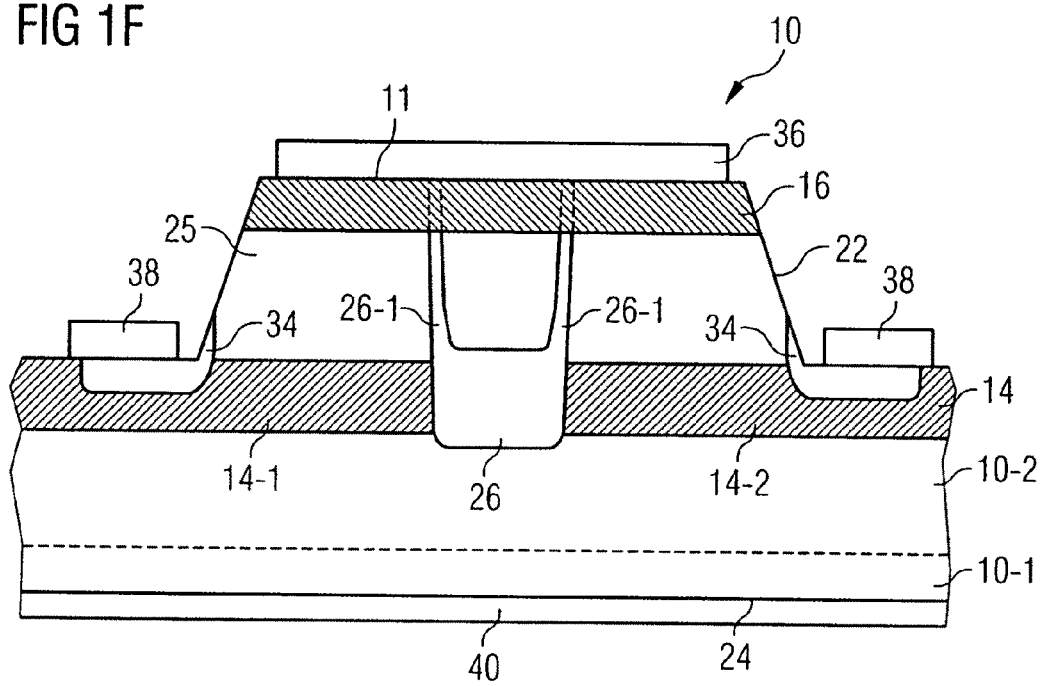

The structure of a thus formed semiconductor device is shown in FIG. 1F. The device comprises a semiconductor body 10. Illustrated here is the arrangement of the semiconductor body 10 which can be formed by a highly n-doped single-crystal semiconductor body 10-1 and a single lowly n-doped epitaxial layer 10-2. The active regions of the semiconductor device have not been separately epitaxially deposited but formed by implantation in the single-epitaxial layer 10-2. The device can therefore be more easily manufactured at reduced costs. The buried regions 14-1 and 14-2 are laterally spaced apart from each other and extend in a lateral direction parallel, and spaced, to the first surface 11. The respective channel 25 is also substantially laterally arranged and can have a respective length (between a mesa flank 22 and an inner end of a respective buried region) of about 1.5 µm. The thickness of the channels 25 can be about 700 nm. In forward mode, the current flows from the respective source regions 34 through the channels 25 and than through the spacer region 26 towards the second surface 24. A typical SiC-JFET formed according the above described embodiment is designed, depending on the doping concentration of the semiconductor body 10, to block a reverse voltage from about 600V to about more than 2000V and even up to 3500V.

In another embodiment, a semiconductor device comprises a semiconductor substrate of a first conductivity type comprising a surface. The semiconductor substrate is formed by a portion of the semiconductor body and extends from the second surface to an upper edge of the buried region. Accordingly, the buried region, which forms a first region of a second conductivity type, is arranged at the surface of this semiconductor substrate. A mesa-structure of the first conductivity type is arranged on the surface of the semiconductor substrate and partially covers the first region. Other portions of the first region are not covered by the mesa-structure and are exposed. A second region of the second conductivity type is arranged on a surface of the mesa-structure such that the first region and the second region are spaced apart from each other and form a channel region of the first conductivity type therebetween. The second region forms here the surface region. The semiconductor substrate and the mesa-structure form a single epitaxial semiconductor body, which means that the mesa-structure is integrally formed with the semiconductor substrate. Access to the channel is provided at the flanks of the mesa-structure. In addition to that, source regions and first, second and third electrode layers can be arranged as described above.

With respect to FIGS. 2A to 2C another embodiment will be described. This embodiment is a modification of the embodiment shown in FIGS. 1A to 1F. To avoid repetitions, only the modifications will be described in detail.

Similar to FIGS. 1A and 1B an unstructured primary buried layer 14 and a surface region 16 are formed. Subsequently, as illustrated in FIG. 2A, source regions 34 are formed by deep implantation of a dopant 35 of the first conductivity type using a mask 42. The implantation dose used for the formation of the source regions 34 is comparable to the dose given above while higher implantation energy is used. The deep implantation also results in the formation of doping extensions 34-1 of the source region 34, the doping concentration of which will be, however, close to the first surface 11 typically lower than the doping concentration of the surface region 16.

A skilled person will appreciate that the order in which the source region 34, the buried region 14 and the surface region 16 are formed can be changed.

In a subsequent step (FIG. 2B), the buried compensation region 26 is formed in a similar manner as described above in conjunction with FIG. 1D using a mask 29.

In further steps, the mesa-structure 20 and the first, second and third electrode layers 36, 38, 40 are formed in a similar manner as described above. The resulting structure is shown in FIG. 2C.

In the embodiment according to this modification the mesa-structure 20 is formed after formation of the buried compensation region 26. Further, the channel doping can also be adjusted by blanket implantation prior to the mesa-structure formation.

Another modification is shown in FIGS. 3A to 3D. In this embodiment, the buried compensation region 26 is formed prior to the formation of the surface region 16. It is also possible to start with the formation of the buried compensation region 26 followed by the formation of the primary buried region 14 since the order does not influence the relative final doping concentrations. However, starting with the deep implantation of the primary buried region 14 might have the advantage that this implantation is not affected by any crystal disturbance caused by other implantations. Optionally, an intermediate thermal anneal, as in any other embodiment, can be effected to substantially remove crystal damages.

Figure 3C:
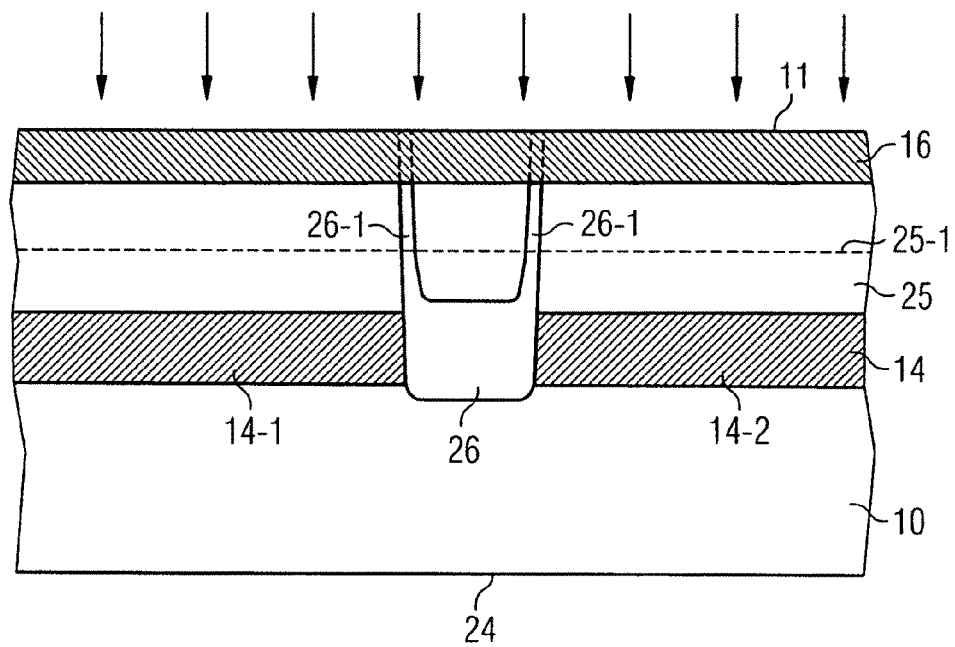
Figure 3D:
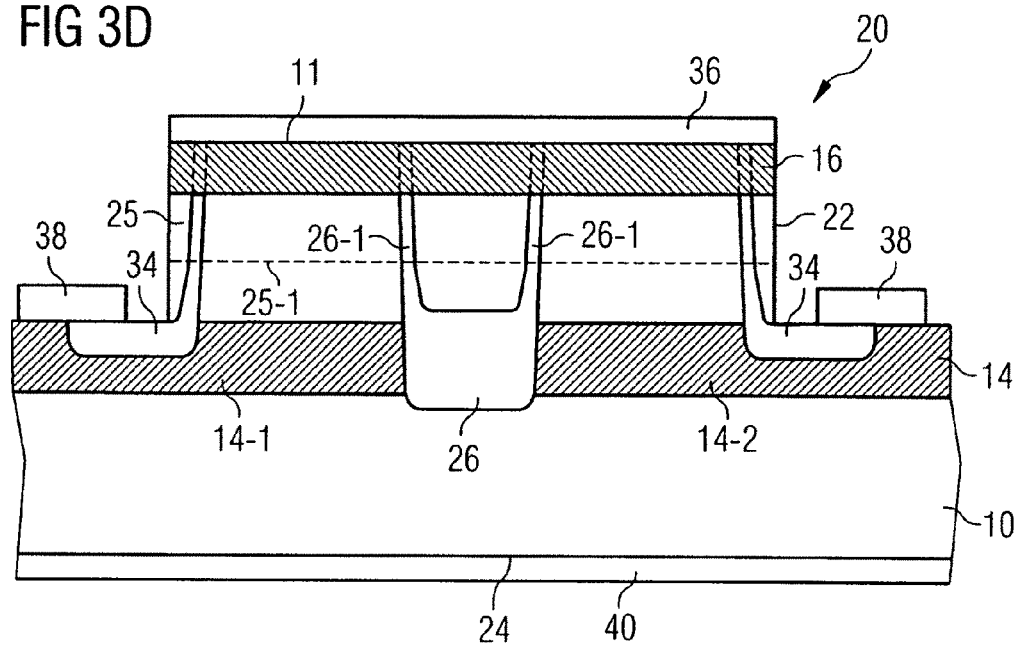

After formation of the buried compensation region 26, the surface region 16 is formed in a similar manner as described above (FIG. 1B) followed by an implantation for adjusting the peak doping level of the central region 25-1 of channel 25 (shown in FIG. 3C) as for instance described above. Subsequently, the mesa-structure 20 is formed by etching the semiconductor body 10. The mesa-structure 20 can also comprise substantially vertical side walls 22. The formation of the mesa-structure 20 results in a partial exposure of the buried regions 14-1, 14-2 and the source regions 34. Finally, the first, second and third electrode layers 36, 38, 40 are formed (FIG. 3D).

Figure 2A:
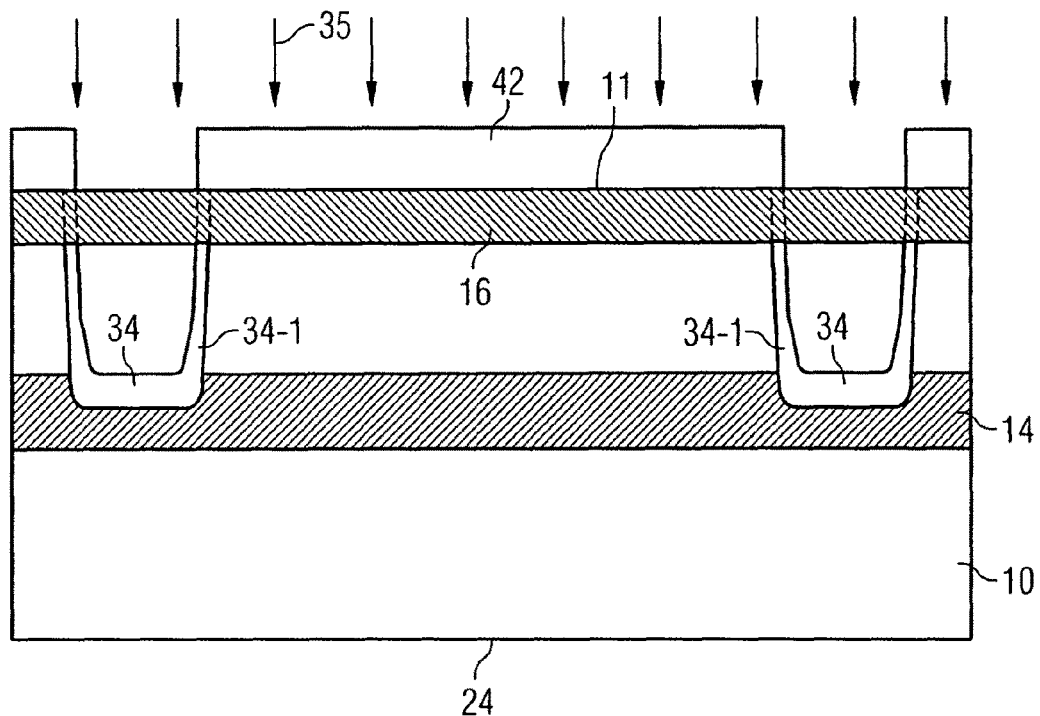
FIGS. 2A to 2C illustrate method steps of a modified embodiment.
Figure 2B:
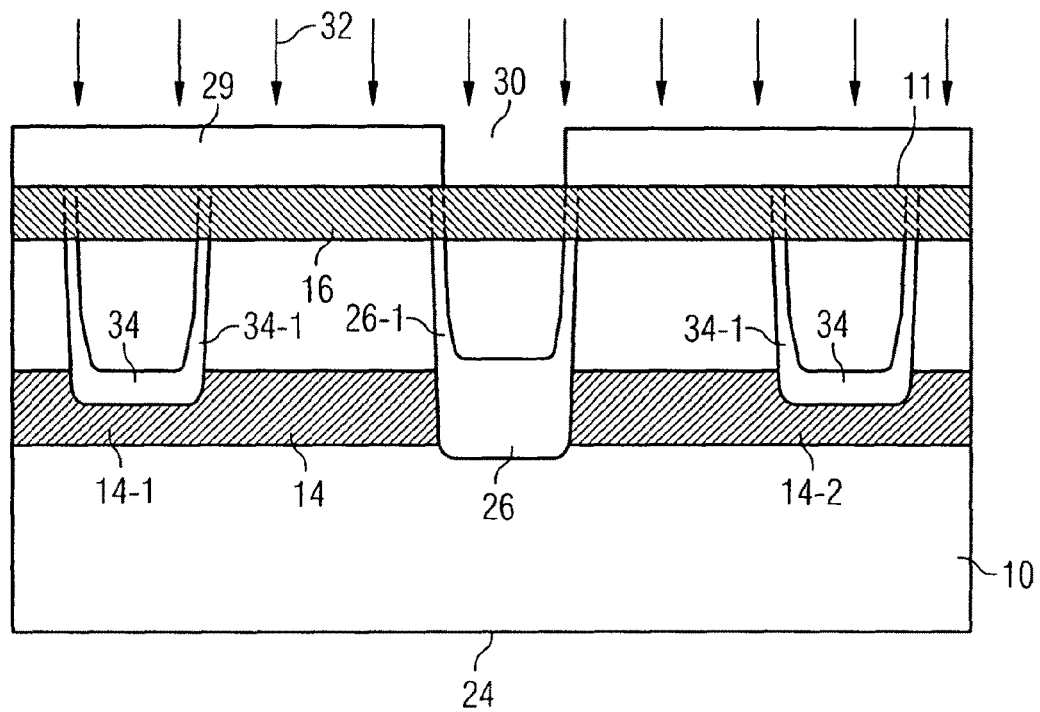
Figure 2C:
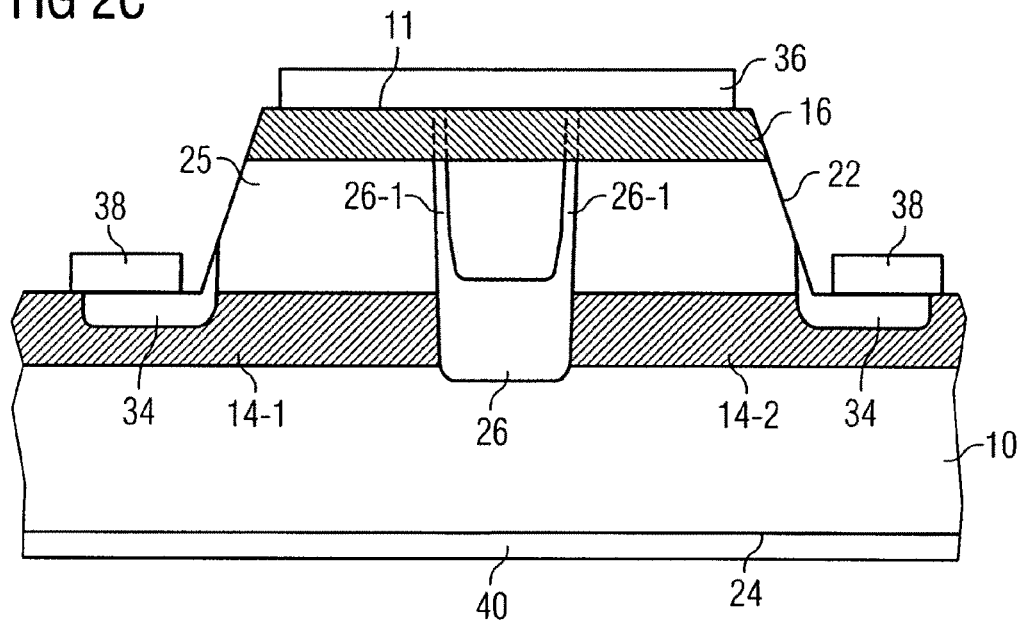

This modified embodiment has the similar advantage as the modified embodiment of FIGS. 2A to 2C in that the implantations are carried out prior to the formation of the mesa-structure 20.

Although not explicitly stated in the above embodiments, a thermal anneal is performed to activate the dopants and to remove crystal defects caused by implantation. Typically, the semiconductor body 10 is annealed at temperatures in the range from about 1400° C. to about 1800° C. and particularly at about 1700° C. The annealing time depends on the annealing method and annealing temperature (RTA for example about 60 sec to about 90 sec, furnace anneal about 60 min). Again, as described above, a surface protection layer may be used. Multiple intermediate thermals anneals can also be performed.

Further, power semiconductor devices typically comprise a plurality of substantially identical cells, each of which defines a separate device. The separate devices have for instance a common drain electrode (third electrode layer 40) and a common source electrode structure (second electrode layer 38) so that the separate devices are connected parallel to each other.

With reference to FIGS. 4A to 4G another embodiment will be described which shows the formation of two buried regions by deep implantation using a mask.

A semiconductor body 10, similar to the one described above, is provided. A first mask 50 is formed on the first surface 11 of the semiconductor body 10. The first mask 50 is composed of a first, lower layer 51 and a second, upper layer 52. First and second layers 51, 52 are comprised of different materials which are selectively etchable with respect to each other. The first layer 51 can be for instance an oxide layer, such as a silicon oxide layer, while the second layer 52 can be a resist layer. Second layer 52 can be photolithographically structured to serve as an etching mask for the first layer 51. The first layer 51 is etched such that the second layer 52 partially overhangs the first layer 51.

The first mask 50 comprises at least two openings 53 (first openings) for defining the lateral arrangement of at least two buried regions which are subsequently formed.

Both first and second layers 51, 52 are then used as first mask 50 for implanting a first dopant 12 of the second conductivity type into the semiconductor body 10 for forming two buried regions 54 which are laterally spaced apart from each other by a spacer region 55. The same implantation dose and energy as for the formation of the primary buried region 14 given above can be employed to obtain substantially the same doping concentration and depth.

Since a mask is used, doping extensions 54-1 are formed which will be later compensated.

Figure 4A:
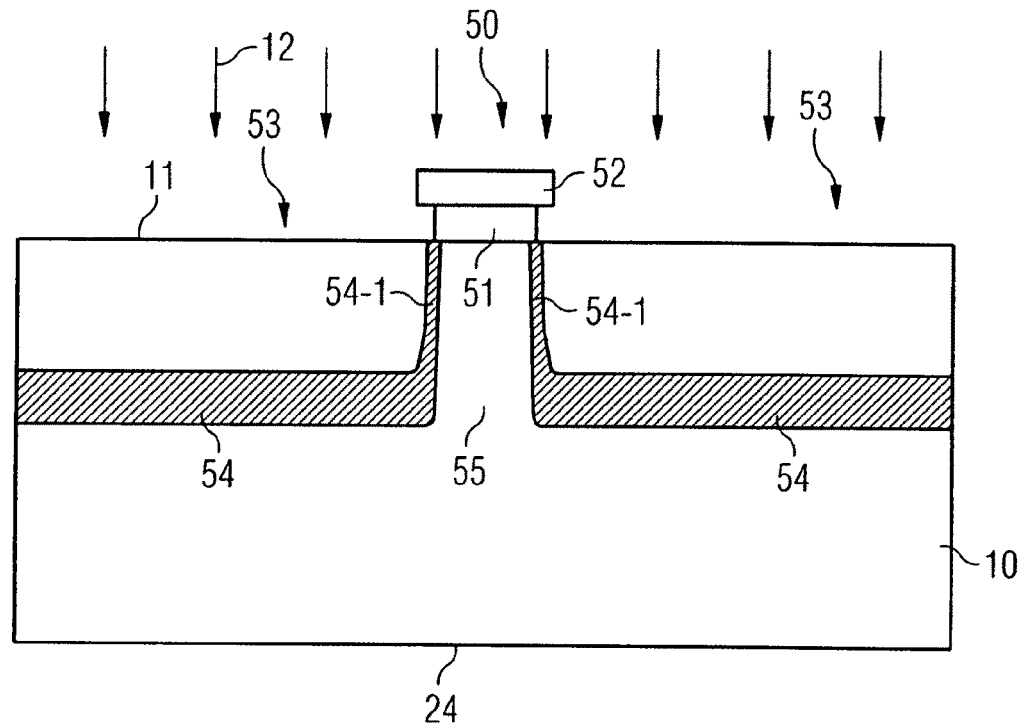
FIGS. 4A to 4G illustrate method steps of another embodiment for forming a semiconductor device comprising a buried layer.
Figure 4B:
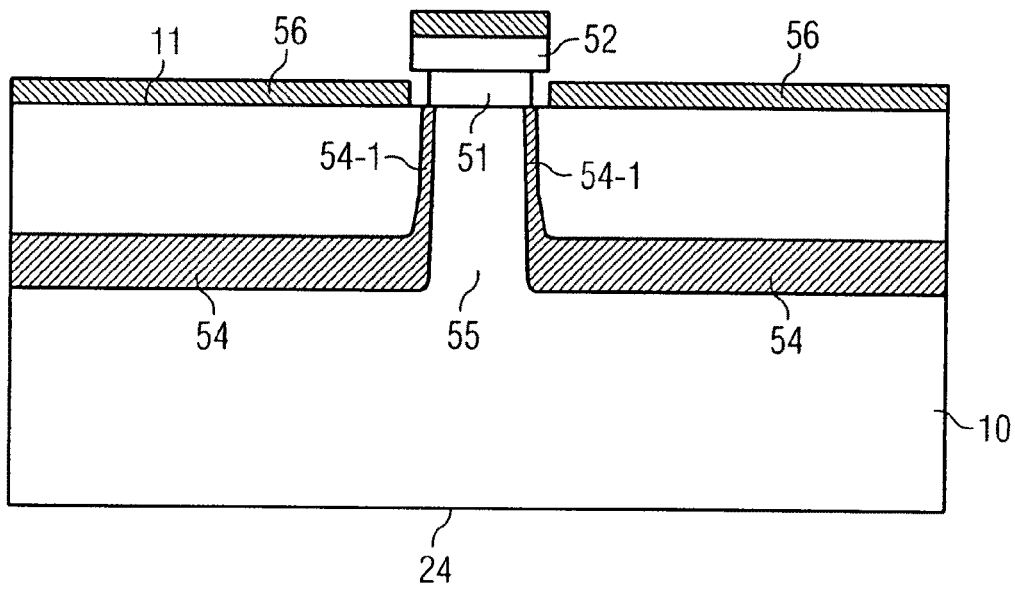

In a subsequent step, as shown in FIG. 4B, a second mask 56 is formed in a self-aligned manner with respect to the first mask 50. For instance, a so-called lift-off process can be used for forming the second mask 56. To this end, a material for the second mask 56 is selected which allows selective removal of the first mask 50 with respect to the second mask 56. The material of the second mask 56 should particularly be substantially inert with respect to the solutions used for removing the first mask. For example, a metal such as Al, Ni, Ti is blanket deposited by substantially vertical deposition such that a mask portion of the second mask 56 formed on the first mask 50 is separated from mask portions of the second mask 56 formed directly on the first surface 11 of the semiconductor body 10. By removing the second layer 52, for instance by chemically dissolving the resist, the portion of the second mask 56 on the first mask 50 is also removed. Subsequently, the first layer 51 is also removed. Alternatively, the first layer 51 can be removed which directly causes lifting-off the second layer 52 and the portion of the mask layer 56 arranged thereon.

The recess of the first layer 51 with respect to the second layer 52 ensures that the deposited layer forming the second mask 56 is reliably separated at the edges of the first mask 51. The recess can also be formed by an additional isotropic etching step directly prior to the deposition of the second mask layer 56.

Figure 4C:
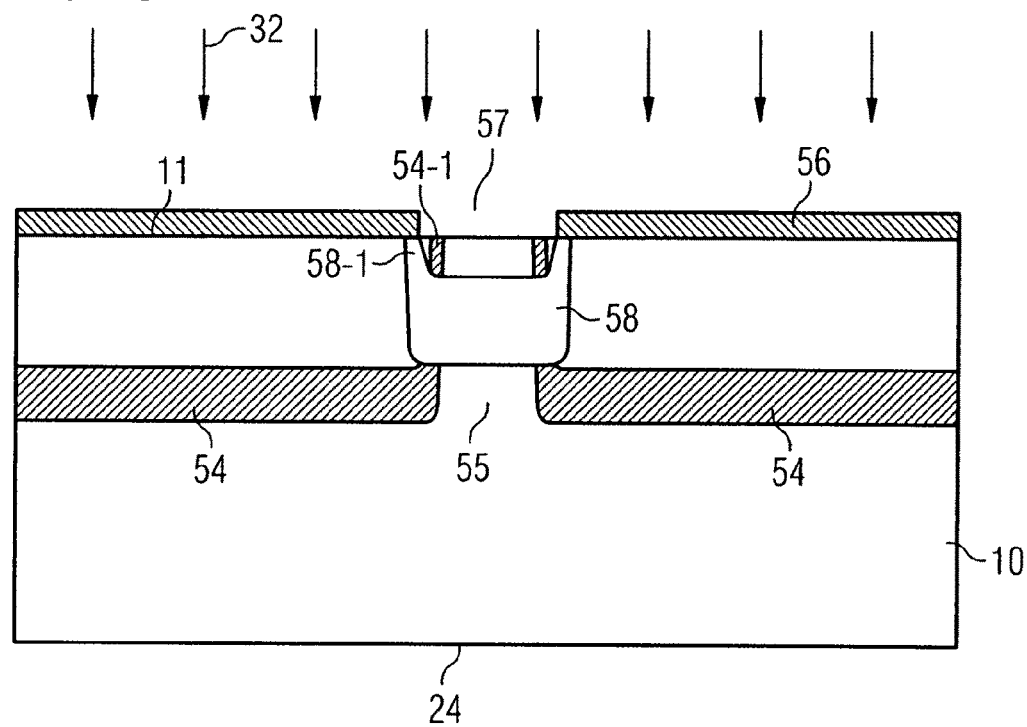
Figure 4D:
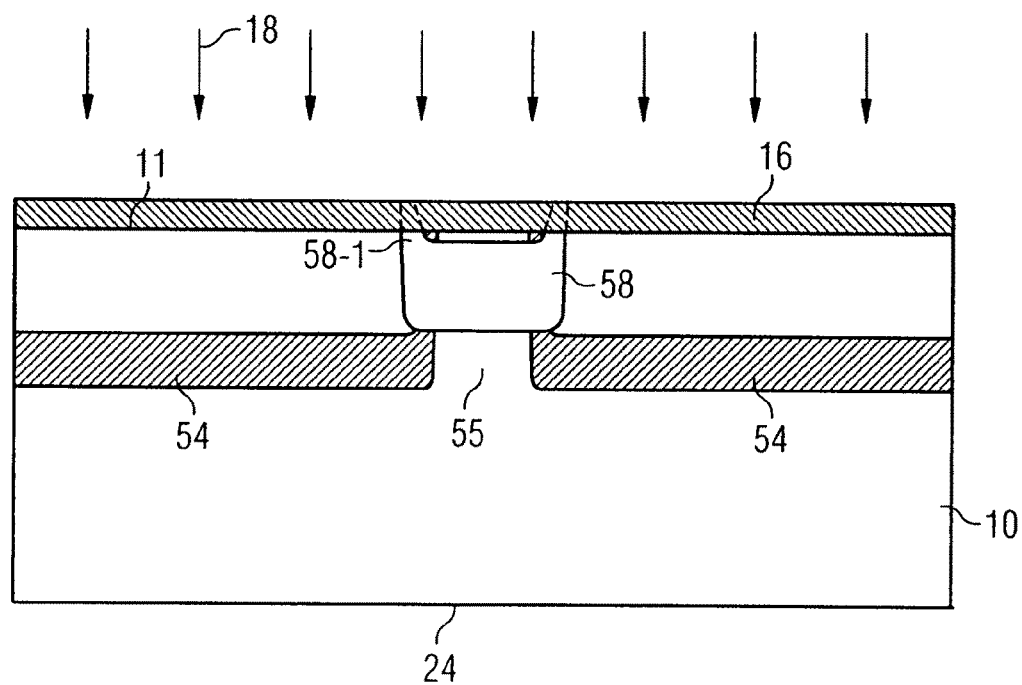

The second mask 56 has an opening 57 (second opening) at the location where the first mask 50 was formed, and covers the area above the buried regions 54. As illustrated in FIG. 4C, a second dopant 32 of the first conductivity type is then implanted in the semiconductor body 10 for forming a buried compensation region 58 of the first conductivity type. The buried compensation region 58 is formed in a plane above the buried regions 54 and covers an area arranged above and between the buried regions 54 such that the doping extensions 54-1 of the buried regions 54 are at least partially compensated. The buried region 58 is therefore arranged in the channel region of the JFET. Compensation near the first surface is not required since the surface region 16 will be formed there. Since the doping concentration of the doping extensions 54-1 is lower than the doping concentration of the buried regions 54, the final doping concentration of the buried compensation region 58 can be reduced in comparison to the buried compensation region 26 described in connection with FIGS. 1A to 1F. For example, a total implantation dose of about $1*10^{13}/cm^2$ to about $1.75*10^{13}/cm^2$ can be used at implantation energy from about 300 keV to about 600 keV. The resulting peak doping concentration of the buried compensation region 58 is typically in the range from about $2*10^{17}/cm^3$ to about $2*10^{18}/cm^3$ and for example about $1.2*10^{18}/cm^3$. Two, three or more implantation steps at different energies can also be used for forming the buried compensation region 58. The resulting region will have a more box-liked cross-section.

Formation of the buried compensation region 58 may cause formation of doping extensions 58-1 which will be compensated by a subsequent shallow implantation of a third dopant 18 of the second conductivity type. The shallow implantation results in the formation of a surface region 16 above, and spaced to, the buried regions 54 and can be performed as described above. The order of the formation of the buried compensation region 58 and the surface region 16 can also be reversed.

Figure 4E:
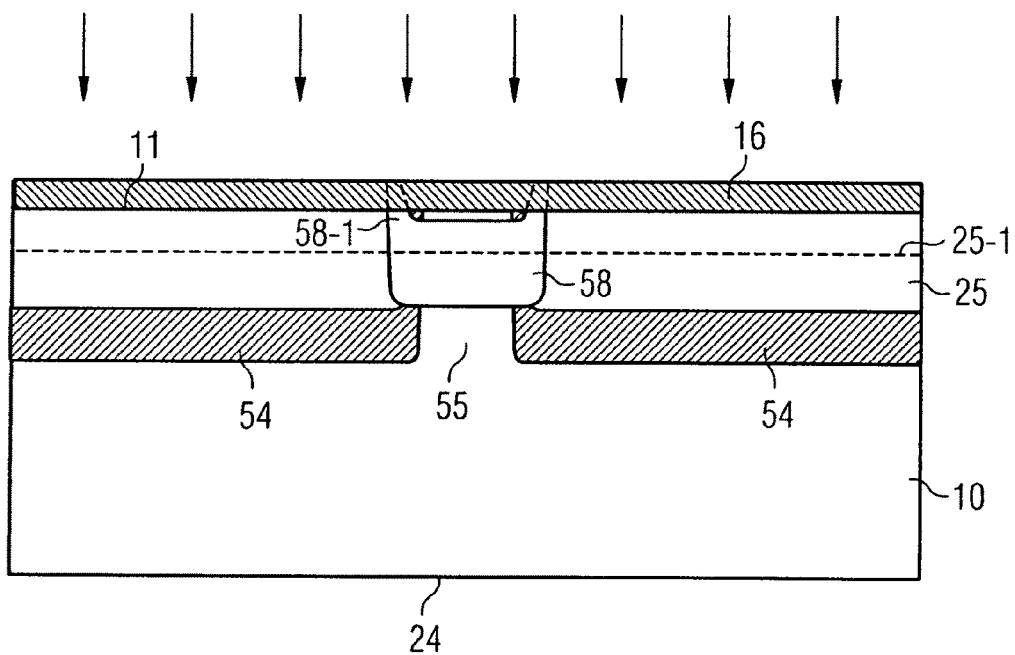

In a further step, the peak channel doping concentration can be adjusted by a blanket implantation of a dopant of the first conductivity type. The implantation dose used for forming the buried compensation region 58 should be considered when performing a channel implantation since both implantations add to the final doping concentration of the channel 25. The final peak doping concentration in the central region 25-1 of channel 25 is, similar to the embodiment described above, from about $2*10^{17}/cm^3$ to about $3*10^{17}/cm^3$. A similar implantation dose and energy for the channel implantation is used as describe above. The implanted dopants are indicated in FIG. 4E by dotted line 25-1.

The order for adjusting the channel doping and forming of the surface region 16 can be reversed as well.

Figure 4F:
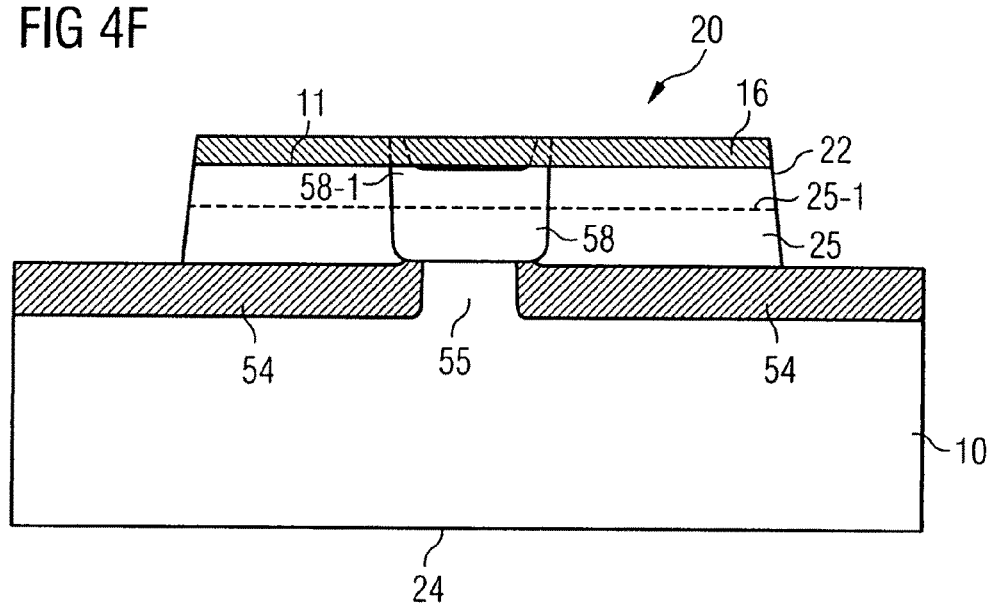
Figure 4G:
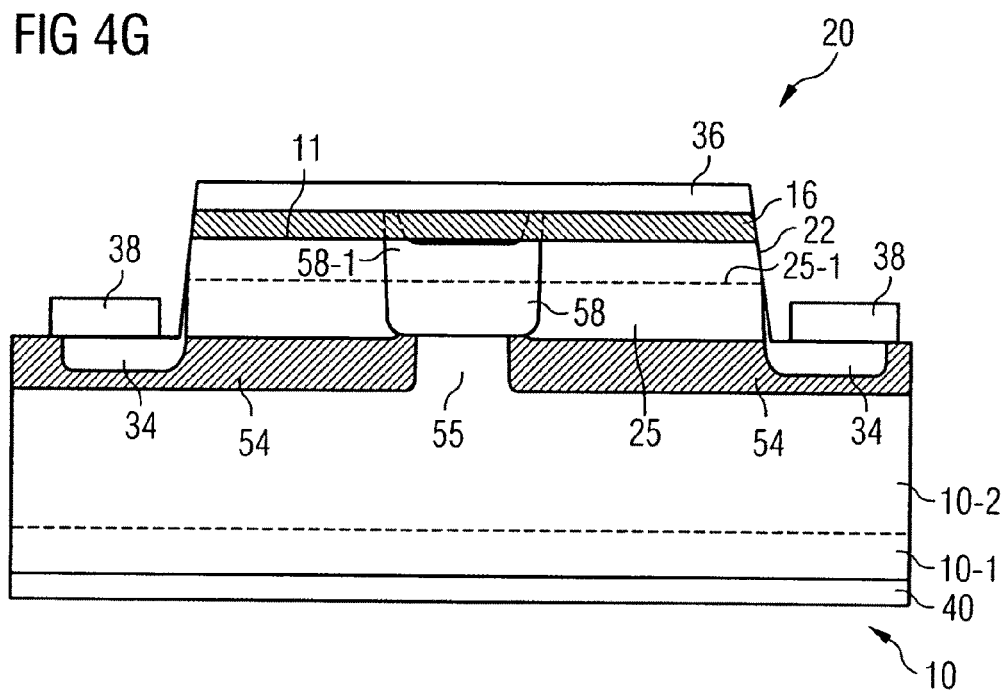

In a further step, illustrated in FIG. 4F, the semiconductor body 10 is etched to form a mesa-structure 20 which results in a partial exposure of the buried regions 54. Finally, the source regions 34 and first, second and third electrode layers 36, 38 and 40 are formed as described above. The resulting structure is shown in FIG. 4G. The functional regions of this structure comprise doping concentrations similar to doping concentrations of respective functional regions as described in conjunction with the embodiments above. Further, the semiconductor body 10 can, as in the above embodiments, be formed by a highly n-doped single-crystal semiconductor body 10-1 and a single low n-doped epitaxial layer 10-2, wherein the functional regions (buried region, surface region, channel region and source region) are formed by implantation in the single low-doped epitaxial region 10-2 unlike common JFETs which are formed by multiple separate epitaxial deposition steps.

Figure 5A:
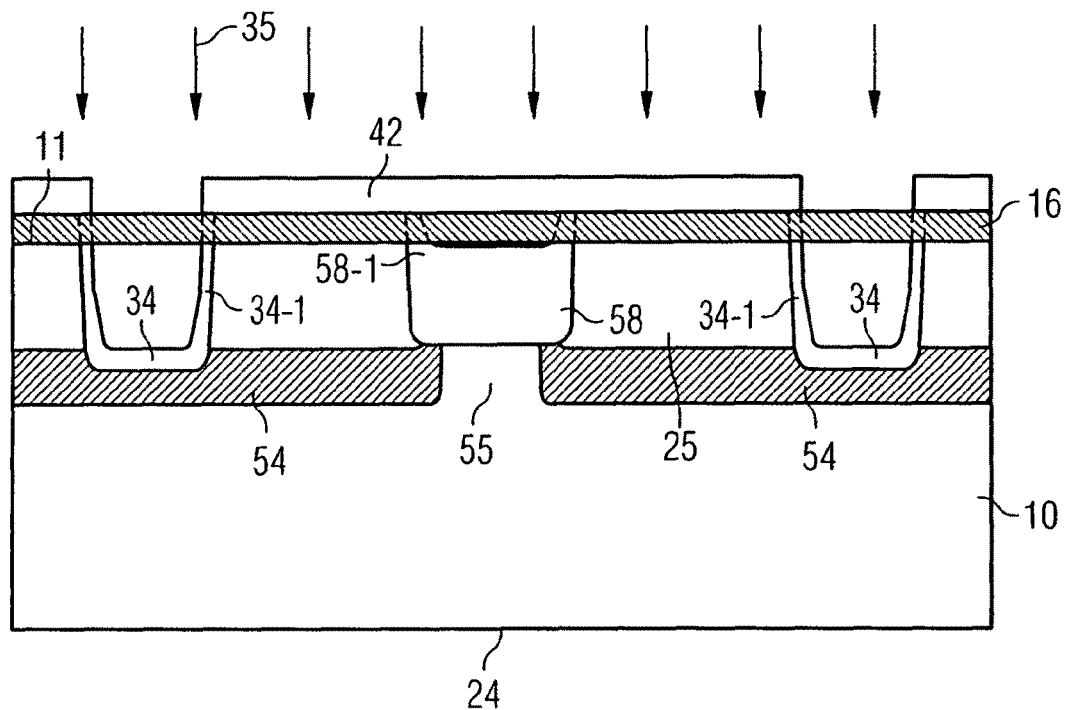
FIGS. 5A and 5B illustrate method steps of a modified embodiment.
Figure 5B:
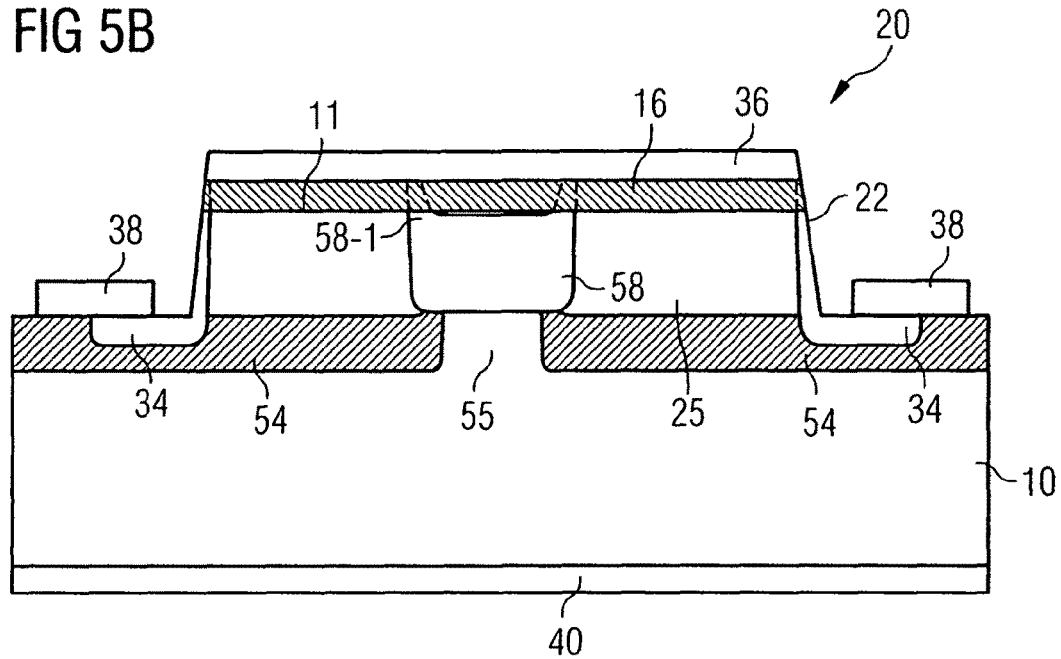

A modification of the embodiment illustrated in FIGS. 4A to 4G will described in conjunction with FIGS. 5A and 5B.

In this modification, the buried regions 54 and the buried compensation regions 58 are formed using the first and the second mask 50 and 56, respectively, while for the channel doping and the formation of the surface region 16 a blanket implantation is used. In addition to that, the source regions 34 are formed by deep implantation using a mask 42 as described in conjunction with FIG. 2A. The resulting structure is shown in FIG. 5A.

After the above implantations, the mesa-structure 20 is formed by etching the semiconductor body 10 using a suitable etching mask. Subsequently, the electrode layers 36, 38 and 40 are formed. The resulting structure is shown in FIG. 5B.

The switching characteristic of a JFET formed by deep implantation in a semiconductor body has been simulated for evaluating its performance. Further, such a JFET has been compared with a JFET formed by epitaxy. In the remainder of this description, the JFET formed as described herein is referred to as implanted JFET while the reference JFET is referred to as epitaxial JFET. Further, the buried regions 14, 54 will be referred to as p2-region while the surface region 16 will be referred to as p1-region. The epitaxial JFET also comprises a p1- and a p2-region between with a channel arranged therebetween.

For a realistic comparison, the channel width of both JFETs has been assumed to be in the order of about 600 nm to compensate specific effects of the respective manufacturing processes. For example, epitaxial deposition of a layer of a first conductivity type on the p2-layer leads to a rather sharp vertical pn-junction since the temperature used for the epitaxial deposition is not high enough for a significant out-diffusion of the dopants out of the p2-region. Different thereto, the deep implantation exhibits a typical Gaussian distribution in vertical direction thus leading to a "softer" pn-junction in comparison with the pn-junction of the epitaxial JFET.

Further, the channel of the implanted JFET may comprise implantation defects in case that not all defects could be removed in SiC at the selected annealing temperature.

Figure 9:
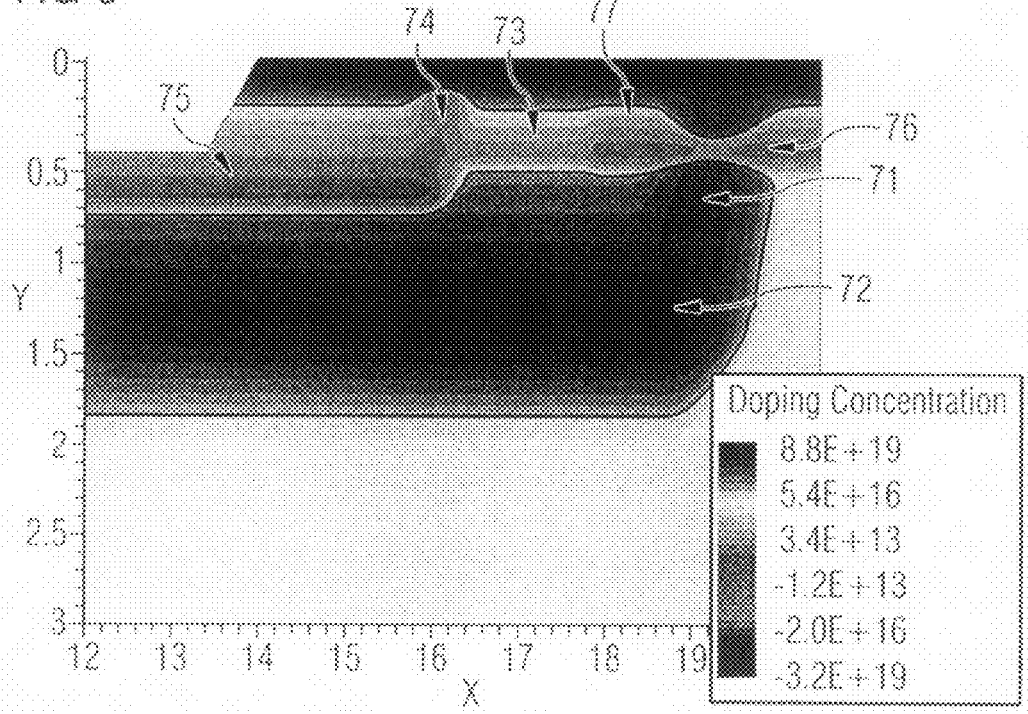
FIG. 9 illustrates the resulting doping concentration of a semiconductor device comprising a structured buried layer which has been formed by a masked deep implantation.

The distribution of the doping concentration of the implanted JFET in a vertical cross-section perpendicular to the first surface 11 is shown in FIG. 9, wherein only the left half of the structures shown in the FIGS. 1 to 5 is illustrated. As shown in FIG. 9, the doping extension (indicated by arrow 71) of the buried region 72 (p2-region) causes a reductioning extension 74 of the source region 75 leads to an increase of the cross-sectional area of the channel 73.

The reduction of the cross-sectional area of the channel by the doping extension 71 could be lessening by increasing the doping concentration of the channel 73 and/or the buried compensation region 76. Buried compensation region 76 has only diminishing doping extensions 77 since this region has been implanted in an area above the buried region 72 with less implantation energy and at lower dose than used for implanting the buried region 72. However, increasing the doping concentration of the buried compensation region 76 and the channel region 73 increases the pinch-off voltage of the JFET so that a trade-off between pinch-off voltage and forward current (defined by the channel conductivity) must be obtained.

FIG. 9 also illustrates that a reduction of the doping extensions is highly desired to reduce their impact and to lower the constraints on the compensation concentration.

Further, FIG. 9 also shows that the size and the doping concentration of the doping extensions increase with the implantation dose. For example, the doping extension 74 of source region 75 is more pronounced than the doping extension 77 of buried compensation region 76. Since the buried compensation region 76 is only for compensating the doping extension 71 of the buried region 72, the total dose required for the buried compensation region 76 is less than the dose used for forming the buried region 72. Hence, the resulting doping concentration of the channel region 73 in the area of the buried compensation region 76 does not significantly exceed the optimum channel doping concentration. Further, the compensated area is comparably small if only the doping extensions 71 need to be compensated which also restrict the areas with reduced charge carrier mobility. The embodiments described in conjunction with FIG. 4A to 5B therefore results in JFETs having a slightly better performance than the JFETs formed according to the embodiments shown in FIGS. 1A to 3D.

In all simulations, the implanted JFET has a compensation doping concentration of about $1.5*10^{13}/cm^3$. Further, the buried regions has been formed by masked implantation with a subsequent formation of a buried compensation region as for instance described in conjunction with FIGS. 4A to 4G and FIGS. 5A and 5B.

Figure 10A:
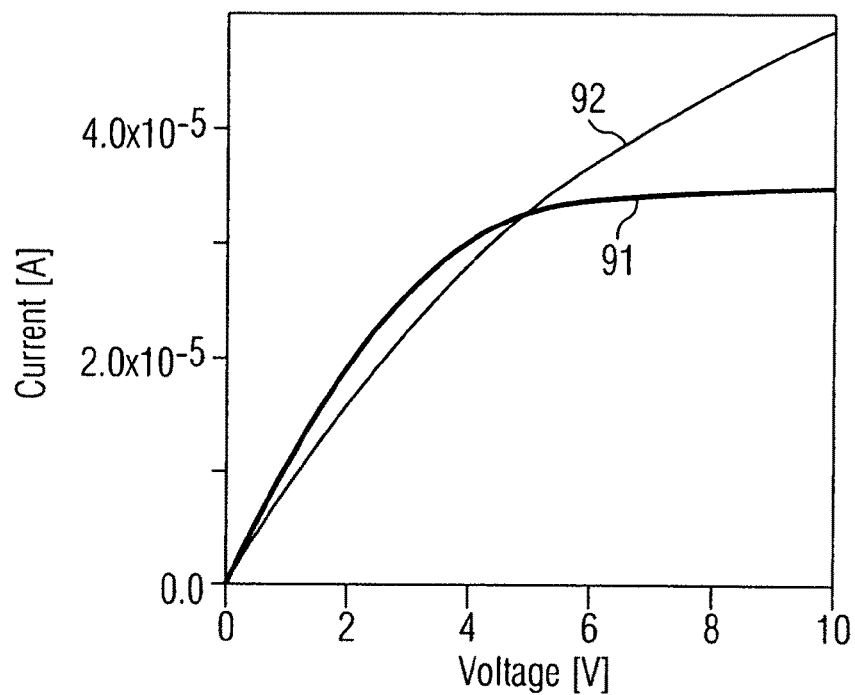
FIGS. 10A and 10B show a comparison between the forward current of an implanted JFET and an epitaxial JFET.
Figure 10B:
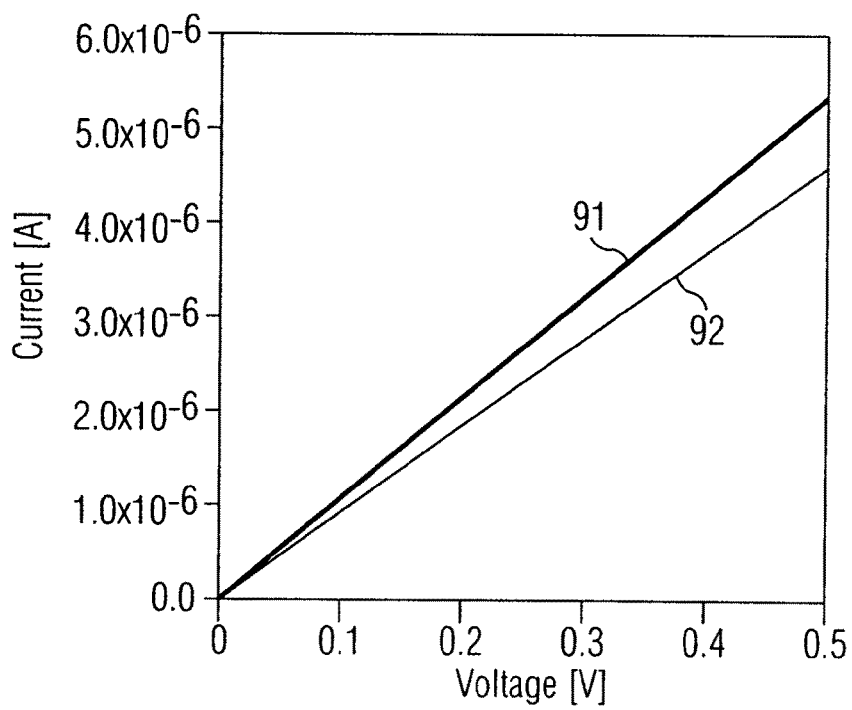

FIGS. 10A and 10B show the simulation results for an individual cell of a power JFET, wherein 91 denotes the forward current of the epitaxial JFET while 92 denotes the forward current of the implanted JFET. FIG. 10B shows a zoomed portion of the transfer characteristic shown in FIG. 10A. As it becomes apparent from FIG. 10A, the forward current 91 of the epitaxial JFET tends to reach its saturation at mean voltages (voltage between source and drain) whereas the forward current 92 of the implanted JFET still increases. It is assumed that this is the result of the different doping profiles of the epitaxial JFET and the implanted JFET. The epitaxial JFET has typically sharper doping profiles than the implanted JFET since implantation leads to typical Gaussian doping profiles whereas sharp doping profiles can be obtained by separate epitaxial depositions.

Figure 11:
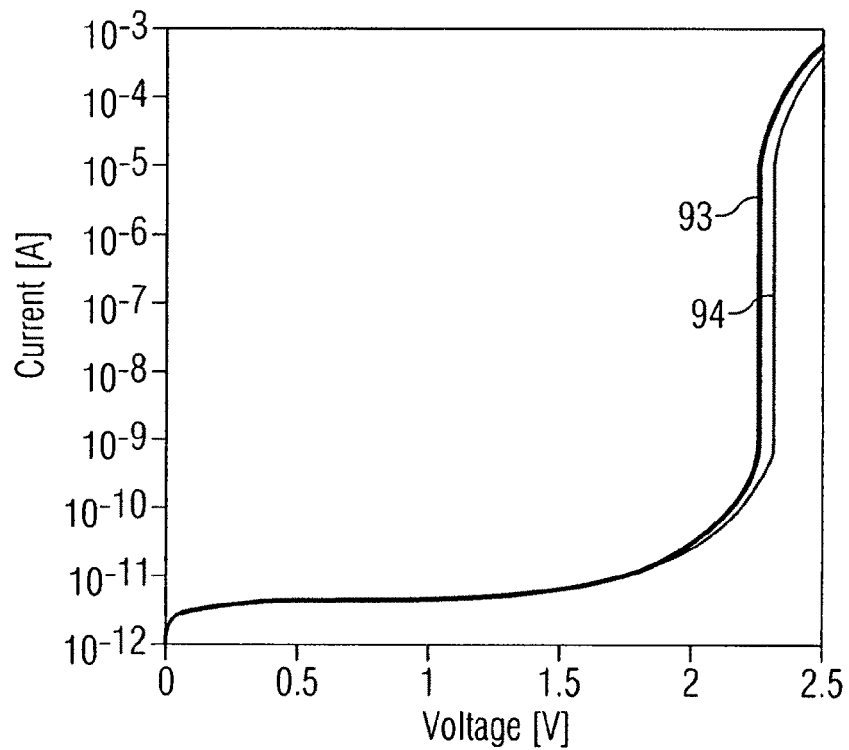
FIG. 11 shows a comparison between the reverse current of an implanted JFET and an epitaxial JFET.

The gate-drain reverse characteristic is substantially the same for both devices as shown in FIG. 11, wherein 93 denotes the characteristics of the epitaxial JFET while 94 that of the implanted JFET.

Figure 12:
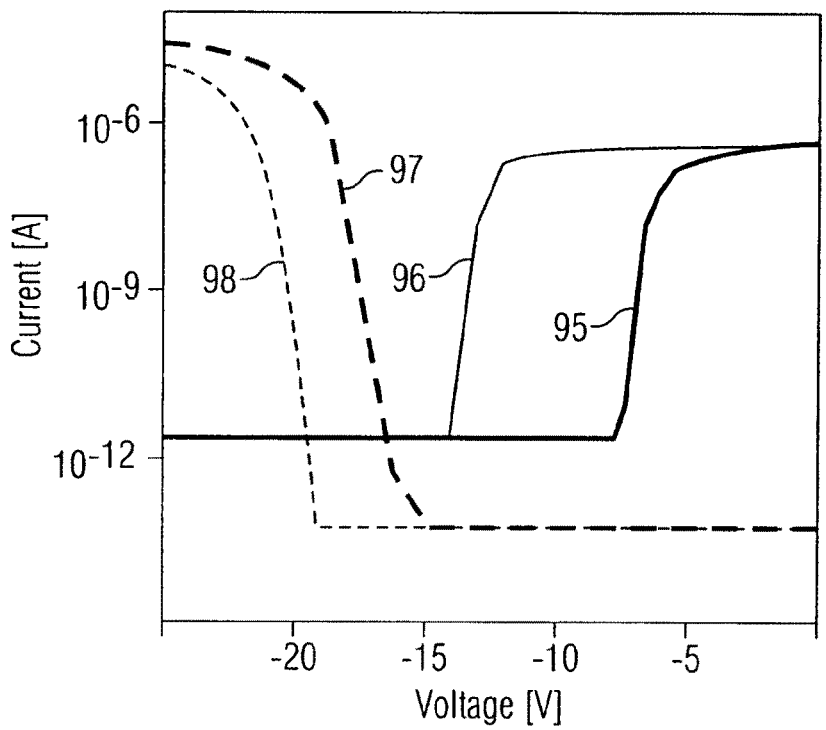
FIG. 12 shows a comparison between the transfer characteristic of an implanted JFET and an epitaxial JFET.

FIG. 12 shows the pinch-off characteristics (solid lines) and the punch-through characteristics (dashed lines) of the epitaxial JFET 95, 97 and the implanted JFET 96, 98, respectively. The voltage of the abscissa refers to the voltage between the p1- and the p2-regions which controls the conductivity of the channel.

Curves 95 and 96 show the drain current which exhibits an abrupt reduction when the channel is blocked. The onset is shifted for the implanted JFET (96) to higher negative voltages due to the different doping profiles of the epitaxial JFET (95) and the implanted JFET. On the other hand, the gate current indicated by curve 97 for the epitaxial JFET and by 98 for the implanted JFET shows that the punch-through, i.e. the onset of the parasitic bipolar transistor, is also shifted to higher negative voltages for the implanted JFET.

The simulations show that pinch-off and punch-through of the implanted JFET occur at different voltages and that a sufficiently high voltage gap is available between them which enables reliable switching of the device.

The simulations show that a fully operational JFET can be manufactured by applying a deep implantation instead of an epitaxial deposition. Any implantation artefacts can be partially or substantially completely compensated by appropriate compensation regions.

The written description above uses specific embodiments to disclose the invention, including the best mode, and also to enable any person skilled in the art to make and use the invention. While the invention has been described in terms of various specific embodiments, those skilled in the art will recognise that the invention can be practiced with modification within the spirit and scope of the claims. Especially, mutually non-exclusive features of the embodiments described above may be combined with each other. The patentable scope is defined by the claim, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for manufacturing a semiconductor device, comprising:
    providing a semiconductor body of a first conductivity type, the semiconductor body comprising a first surface;
    forming at least one buried region of a second conductivity type in the semiconductor body, wherein the buried region is formed by deep implantation of a first dopant of the second conductivity type,
    wherein the step of forming the one least a buried region comprises forming at least two buried regions which are substantially arranged in a same plane and are spaced apart from each other by a spacer region of the first conductivity type; and
    forming at least a surface region of the second conductivity type at the first surface of the semiconductor body, wherein the buried region and the surface region are formed in spaced-relation to each other.

2. The method of claim 1, wherein the first dopant is implanted with implantation energy in the range from about 1000 keV to about 1800 keV.

3. The method of claim 1, wherein the first dopant is implanted with a dose from about $0.5*10^{14}/cm^2$ to about $2*10^{14}/cm^2$.

4. The method of claim 1, wherein the step of forming at least two buried regions comprises:
    forming at least a primary buried region of the second conductivity type by deep implantation of the first dopant; and
    forming, by deep implantation of a second dopant of the first conductivity type, at least a buried compensation region of the first conductivity type in the semiconductor body for partitioning the primary buried region into at least two buried regions, the buried compensation region being formed such that the conductivity type of the primary buried region is reversed in at least a pre-defined region defining the spacer region.

5. The method of claim 4, wherein the second dopant is implanted with a total dose which is higher than a dose used for implanting the primary buried region.

6. The method of claim 5, wherein the total dose of the second dopant is higher than $2*10^{14}/cm^2$.

7. The method of claim 4, wherein the deep implantation of the second dopant comprises at least two separate implantations steps at different implantation energies.

8. The method of claim 4, wherein the implantation energy is in the range from about 800 keV to about 2000 keV.

9. The method of claim 4, wherein the at least one primary buried region is formed without using a mask on the first surface of the semiconductor body.

10. The method of claim 1, wherein the step of forming the at least two buried regions comprises:
    forming a first mask comprising at least two first openings on the first surface of the semiconductor body for defining the location of the buried regions; and
    implanting the first dopant of the second conductivity type into the semiconductor body for forming the two buried regions.

11. The method of claim 10, further comprising:
    forming a second mask comprising at least a second opening on the first surface of the semiconductor body for defining the location of at least one buried compensation region, the second opening being arranged above the spacer region; and
    implanting a second dopant of the first conductivity type in the semiconductor body for forming the buried compensation region of the first conductivity type such that the buried compensation region is arranged between the spacer region and the surface region.

12. The method of claim 11, wherein the second mask is formed in a self-aligned manner with respect to the first mask.

13. The method of claim 11, wherein second dopant is implanted with implantation energy in the range from about 300 keV to about 600 keV.

14. The method of claim 11, wherein the second dopant is implanted with a total dose in the range from about $1*10^{13}/cm^2$ to about $1.75*10^{13}/cm^2$.

15. A method for manufacturing a semiconductor device, comprising:
    providing a semiconductor body of a first conductivity type, the semiconductor body comprising a first surface;
    forming at least one buried region of a second conductivity type in the semiconductor body, wherein the buried region is formed by deep implantation of a first dopant of the second conductivity type;
    forming at least a surface region of the second conductivity type at the first surface of the semiconductor body, wherein the buried region and the surface region are formed in spaced-relation to each other; and
    removing portions of the semiconductor body to partially expose the buried region and to form at least one mesa-structure which partially covers the buried region.

16. The method of claim 15, further comprising forming at least a first electrode layer on the mesa-structure.

17. The method of claim 15, further comprising forming at least a source region of the first conductivity type in the semiconductor body such that the source region is at least partially arranged in an exposed area of the buried region adjacent to the mesa-structure.

18. The method of claim 17, further comprising forming a second electrode layer such that the second electrode layer is in contact with the source region and the exposed buried region.

19. A method for manufacturing a semiconductor device, comprising:
providing a semiconductor body of a first conductivity type, the semiconductor body comprising a first surface;
forming at least one buried region of a second conductivity type in the semiconductor body, wherein the buried region is formed by deep implantation of a first dopant of the second conductivity type;
forming at least a surface region of the second conductivity type at the first surface of the semiconductor body, wherein the buried region and the surface region are formed in spaced-relation to each other; and
adjusting the doping concentration of the semiconductor body in a region arranged between the buried region and the surface region to a pre-defined peak-value.

20. A method for forming a junction field effect transistor, comprising:
providing a semiconductor body of a first conductivity type, the semiconductor body comprising a first surface;
forming at least two buried regions of a second conductivity type in the semiconductor body by deep implantation of a first dopant of the second conductivity type, wherein the buried regions are substantially arranged in a same plane and are spaced apart from each other by a spacer region of the first conductivity type; and
forming at least a surface region of the second conductivity type at the first surface of the semiconductor body by a shallow implantation of a dopant of the second conductivity type such that the buried regions and the surface region are spaced apart from each other.

21. The method of claim 20, further comprising removing portions of the semiconductor body to partially expose the buried regions and to form at least one mesa-structure which partially covers the buried regions.

22. The method of claim 20, wherein the step of forming the at least two buried regions comprises:
forming, by deep implantation of the first dopant, a primary buried region of the second conductivity type; and
forming at least one buried compensation region of the first conductivity type in the semiconductor body for partitioning the primary buried region into at least two buried regions, wherein the buried compensation region is formed such that the conductivity type of the primary buried region is reversed in at least a pre-defined region which defines the spacer region, and wherein the buried compensation region is formed by deep implantation of a second dopant of the first conductivity type.

23. The method of claim 20, wherein the step of forming at least two buried regions comprises:
forming a first mask comprising at least two first openings on the first surface of the semiconductor body for defining the location of the two buried regions; and
implanting the first dopant of the second conductivity type into the semiconductor body for forming the two buried regions which are spaced apart from each other by the spacer region.

24. The method of claim 23, further comprising:
forming a second mask comprising at least a second opening on the first surface of the semiconductor body for defining the location of at least one buried compensation region, the second opening being arranged above the spacer region; and
forming the buried compensation region of the first conductivity type by deep implantation of a second dopant of the first conductivity such that the buried compensation region is arranged between the spacer region and the surface region and above the spacer region.

* * * * *